(12) United States Patent
Mishima

(10) Patent No.: US 11,508,928 B2
(45) Date of Patent: Nov. 22, 2022

(54) SELF-LUMINOUS ELEMENT AND SELF-LUMINOUS DISPLAY PANEL

(71) Applicant: JOLED Inc., Tokyo (JP)

(72) Inventor: Kosuke Mishima, Tokyo (JP)

(73) Assignee: JOLED INC., Tokyo (JP)

( * ) Notice: Subject to any disclaimer, the term of this patent is extended or adjusted under 35 U.S.C. 154(b) by 177 days.

(21) Appl. No.: 17/104,025

(22) Filed: Nov. 25, 2020

(65) Prior Publication Data
US 2021/0167315 A1 Jun. 3, 2021

(30) Foreign Application Priority Data

Nov. 29, 2019 (JP) .............................. JP2019-217531
Nov. 13, 2020 (JP) .............................. JP2020-189534

(51) Int. Cl.
*H01L 51/50* (2006.01)
*H01L 51/56* (2006.01)
*G09G 3/3258* (2016.01)
*H01L 27/32* (2006.01)

(52) U.S. Cl.
CPC ...... *H01L 51/5072* (2013.01); *H01L 51/5004* (2013.01); *H01L 51/5092* (2013.01); *H01L 51/5096* (2013.01); *H01L 51/56* (2013.01); *G09G 3/3258* (2013.01); *H01L 27/3211* (2013.01); *H01L 2251/301* (2013.01); *H01L 2251/552* (2013.01); *H01L 2251/558* (2013.01)

(58) Field of Classification Search
CPC ............. H01L 51/5072; H01L 51/5092; H01L 51/5096
See application file for complete search history.

(56) References Cited

U.S. PATENT DOCUMENTS

| | | |
|---|---|---|
| 2007/0020483 A1 | 1/2007 | Park et al. |
| 2007/0241676 A1 | 10/2007 | Park et al. |
| 2009/0039770 A1 | 2/2009 | Kang et al. |
| 2014/0159031 A1 | 6/2014 | Aonuma et al. |
| 2015/0144897 A1 | 5/2015 | Kang et al. |
| 2016/0141539 A1 | 5/2016 | Hoang et al. |
| 2016/0172617 A1 | 6/2016 | Shirahase et al. |
| 2016/0351637 A1 | 12/2016 | Hashimoto et al. |
| 2017/0033314 A1 | 2/2017 | Matsusue et al. |
| 2017/0117347 A1 | 4/2017 | Yamane et al. |
| 2017/0133437 A1 | 5/2017 | Komatsu |

(Continued)

FOREIGN PATENT DOCUMENTS

| | | |
|---|---|---|
| JP | 2007-036175 A | 2/2007 |
| JP | 2007-287691 A | 11/2007 |
| JP | 2008-547196 A | 12/2008 |

(Continued)

*Primary Examiner* — Anthony Ho
(74) *Attorney, Agent, or Firm* — Xsensus LLP

(57) ABSTRACT

A self-luminous element includes: a pixel electrode; a light-emitting layer that is disposed above the pixel electrode and includes a light-emitting material; a first functional layer that is disposed on the light-emitting layer and includes a metal fluoride; a second functional layer that is disposed on the first functional layer and includes a first organic material having at least one of electron transport properties and electron injection properties; and a counter electrode that is disposed above the second functional layer. The second functional layer does not include at least one metallic element selected from the group consisting of alkali metals, alkaline earth metals, and rare earth metals that reduce the metal fluoride.

17 Claims, 15 Drawing Sheets

(56) References Cited

U.S. PATENT DOCUMENTS

| | | | |
|---|---|---|---|
| 2017/0244059 | A1 | 8/2017 | Sasaki et al. |
| 2017/0271613 | A1 | 9/2017 | Ajiki et al. |

FOREIGN PATENT DOCUMENTS

| | | | |
|---|---|---|---|
| JP | 2011-171279 | A | 9/2011 |
| JP | 2013-127858 | A | 6/2013 |
| JP | 2013-235846 | A | 11/2013 |
| JP | 2015-518287 | A | 6/2015 |
| JP | 2016-100074 | A | 5/2016 |
| JP | 2016-115748 | A | 6/2016 |
| JP | 2017-152695 | A | 8/2017 |
| WO | 2006/138075 | A2 | 12/2006 |
| WO | 2013/018251 | A1 | 2/2013 |
| WO | 2015/004882 | A1 | 1/2015 |
| WO | 2015/125448 | A1 | 8/2015 |
| WO | 2015/141144 | A1 | 9/2015 |
| WO | 2015/151415 | A1 | 10/2015 |
| WO | 2015/194189 | A1 | 12/2015 |
| WO | 2016/088378 | A1 | 6/2016 |

FIG. 2
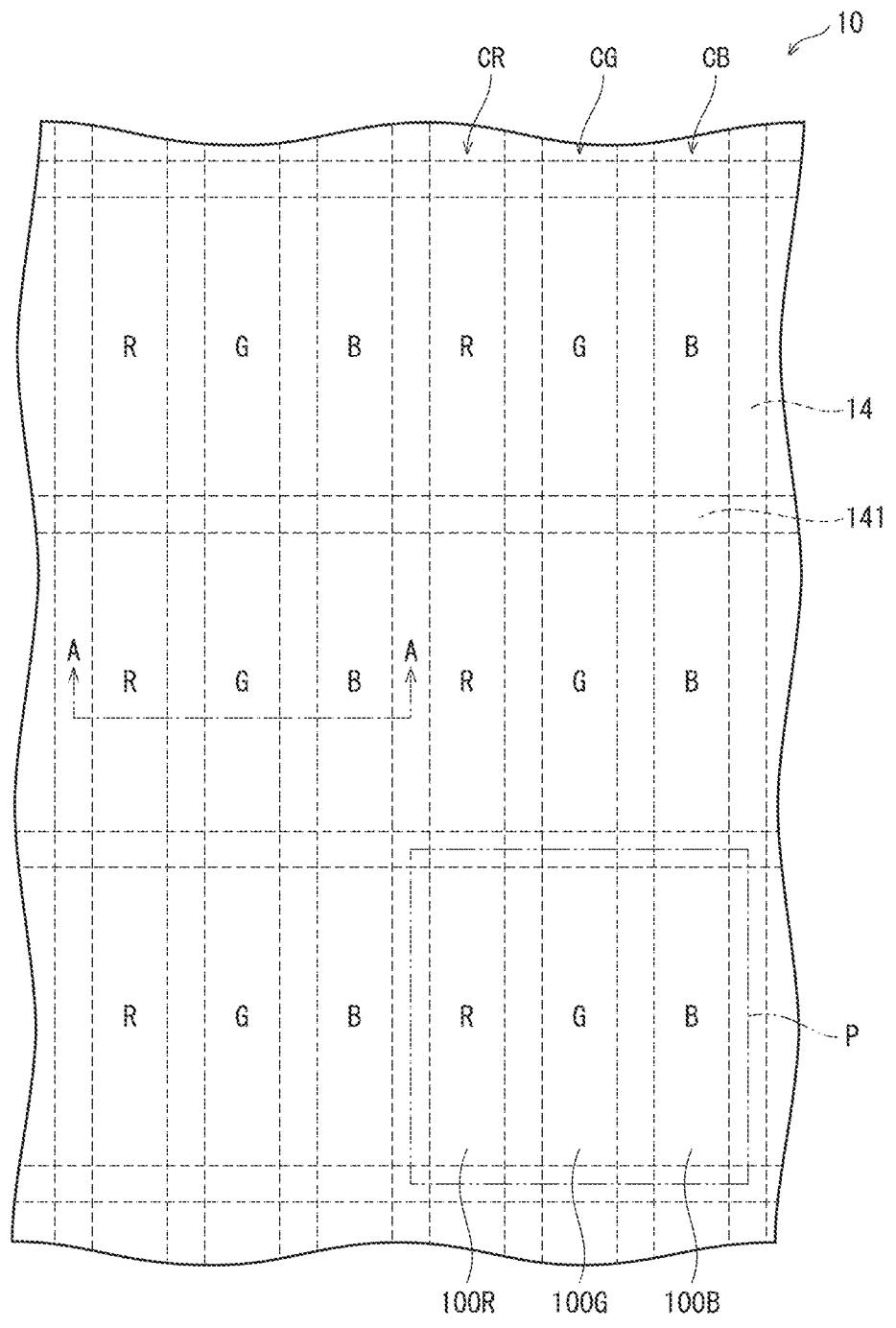
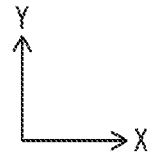

| Counter electrode (cathode) | — 20 |
| Electron injection transport layer (M2) | — 19Y |
| Hole block layer | — 18Y |
| Organic light-emitting layer | — 17 |
| Hole transport layer | — 16 |
| Hole injection layer | — 15 |
| Pixel electrode (anode) | — 13 |

| Counter electrode (cathode) | — 20 |
| Electron injection transport layer (M1) | — 19X |
| Intermediate layer (NaF) | — 18X |
| Organic light-emitting layer | — 17 |
| Hole transport layer | — 16 |
| Hole injection layer | — 15 |
| Pixel electrode (anode) | — 13 |

SELF-LUMINOUS ELEMENT AND SELF-LUMINOUS DISPLAY PANEL

CROSS-REFERENCE TO RELATED APPLICATIONS

This application claims priority to Japanese Patent Application No. 2019-217531, filed Nov. 29, 2019 and Japanese Patent Application No. 2020-189534, filed Nov. 13, 2020, the contents of which are hereby incorporated by reference in their entirety.

BACKGROUND

Technical Field

The present disclosure relates to a self-luminous element and a self-luminous display panel.

Description of Related Art

In recent years, as self-luminous displays using organic electro luminescence (EL) elements employing electroluminescence of organic materials, organic EL display panels in which organic EL elements are arranged in a matrix across a substrate have been put to practical use as displays of electrical equipment. The organic EL elements each have a basic structure in which, between an electrode pair of an anode and a cathode, various functional layers are layered such as an organic light-emitting layer including an organic light-emitting material and an electron transport layer. When driven, a voltage is applied across the electrode pair, and holes injected to the organic light-emitting layer from the anode and electrons injected to the organic light-emitting layer from the cathode recombine to emit light. Thus, the organic EL elements are current-driven light-emitting elements.

There has been a demand for such organic EL elements to have an improved carrier balance between holes and electrons in a light-emitting layer by an appropriate arrangement of the lowest unoccupied molecular orbital (LUMO) and the highest occupied molecular orbital (HOMO) in each functional layer, so as to achieve both a high efficiency of the light-emitting elements and an increased operating life of the light-emitting elements.

In response to this demand, for example International Publication No. WO2015/194189 has proposed light-emitting elements having electron injection properties and an element operating life which are increased by providing an intermediate layer formed from an alkali metal fluoride between an electron transport layer formed from an organic material and an organic light-emitting layer and by doping the electron transport layer with a metal material having a low work function.

Also, Japanese Patent Application Publication No. 2007-36175 has proposed light-emitting elements including a hole block layer (HBL) as a cathode side layer adjacent to a light-emitting layer.

SUMMARY

A self-luminous EL element pertaining to at least one aspect of the present disclosure is a self-luminous element including: a pixel electrode; a light-emitting layer that is disposed above the pixel electrode and includes a light-emitting material; a first functional layer that is disposed on the light-emitting layer and includes a metal fluoride; a second functional layer that is disposed on the first functional layer and includes a first organic material having at least one of electron transport properties and electron injection properties; and a counter electrode that is disposed above the second functional layer. The second functional layer does not include at least one metallic element selected from the group consisting of alkali metals, alkaline earth metals, and rare earth metals that reduce the metal fluoride.

BRIEF DESCRIPTION OF THE DRAWINGS

Objects, advantages, and features of the technology pertaining to the present disclosure will become apparent from the following description thereof taken in conjunction with the accompanying drawings, which illustrate at least one embodiment of the technology pertaining to the present disclosure.

FIG. 2 is a schematic enlarged plan view illustrating part of an image display surface of an organic EL display panel of the organic EL display device pertaining to at least one embodiment of the present disclosure.

FIG. 14A and FIG. 14B are schematic diagrams illustrating layered structures of conventional organic EL elements 2X and 2Y, respectively.

DETAILED DESCRIPTION

According to the above structure described in International Publication No. WO2015/194189 in which the intermediate layer formed from an alkali metal fluoride is provided as a cathode side layer adjacent to the light-emitting layer, properties of blocking holes from the light-emitting layer to the intermediate layer are low. Thus, an insufficient element operating life is exhibited. Also, according to the above structure described in Japanese Patent Application Publication No. 2007-36175 in which the hole block layer is provided as the cathode side layer adjacent to the light-emitting layer, properties of injecting electrons from the hole block layer to the light-emitting layer are low, and an environmental resistance is low due to moisture etc. inside the light-emitting layer penetrating through the electron transport layer. Thus, an insufficient element operating life is exhibited.

There has been a demand for organic EL elements to have an improved carrier balance between holes and electrons in light-emitting layers by an appropriate arrangement of the LUMO and the HOMO in each functional layer, so as to achieve a high efficiency of the light-emitting elements.

Figure 13:
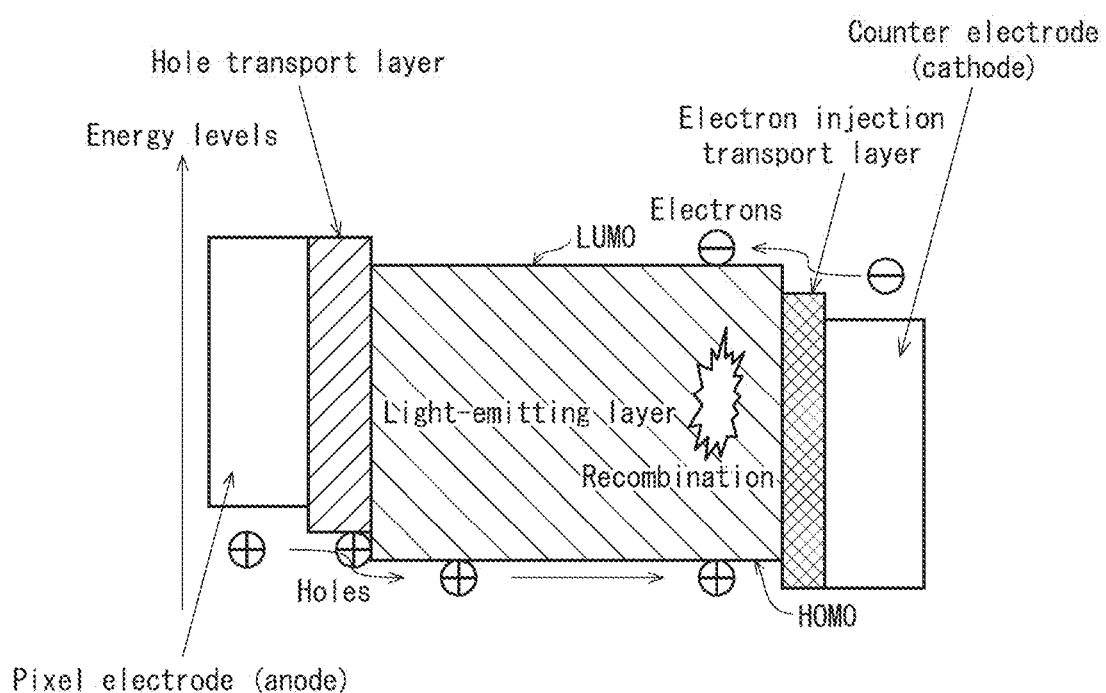
FIG. 13 is a schematic diagram illustrating appropriately balanced energy levels of hole transport layers, light-emitting layers, and an electron injection transport layer of organic EL elements pertaining to at least one embodiment of the present disclosure.

The following describes a method for optimizing movement of carriers inside light-emitting layers in organic EL elements, with reference to the drawings. FIG. 13 is a schematic diagram illustrating appropriately balanced energy levels of hole transport layers, light-emitting layers, and an electron injection transport layer in organic EL elements pertaining to at least one embodiment.

As illustrated in FIG. 13, while voltage is applied between a pixel electrode (anode) and a counter electrode (cathode), holes are supplied from the pixel electrode to the HOMO of the light-emitting layers via the hole transport layers and electrons are supplied from the counter electrode to the LUMO of the light-emitting layers via the electron injection transport layer. Then, the holes, which are supplied to the light-emitting layers from the hole transport layers, and the electrons, which are supplied to the light-emitting layers from the electron injection transport layer, recombine with each other in the light-emitting layers to cause an excited state to emit light.

In this recombination, in the case where an excellent carrier balance is maintained and the electrons and the holes which are injected to the light-emitting layers are quantitatively balanced, recombination between the electrons and the holes occurs with little excess or deficiency. This rarely causes residual holes or electrons, and makes many amounts of holes and electrons to contribute to light emission, thereby optimizing the luminous efficiency of the organic EL elements.

Figure 15A:
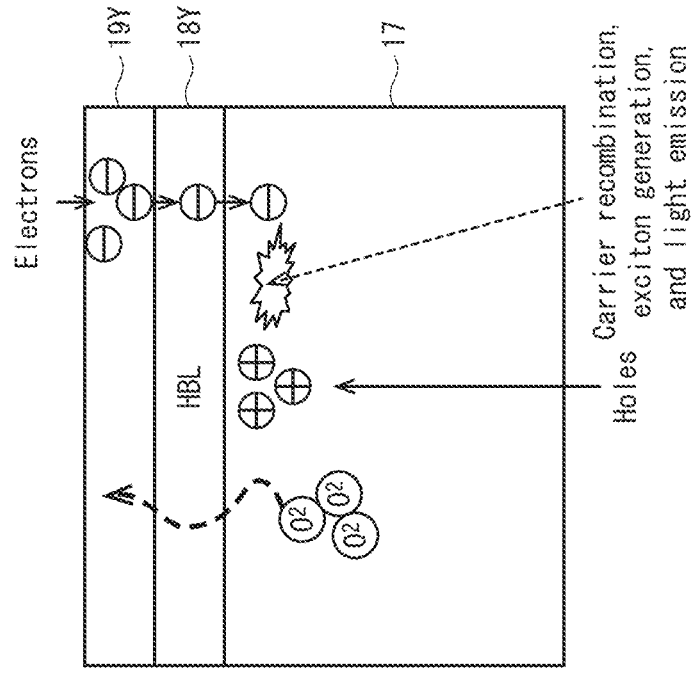
FIG. 15A and FIG. 15B are diagrams for explaining operations of the conventional organic EL elements 2X and 2Y, respectively.
Figure 15B:
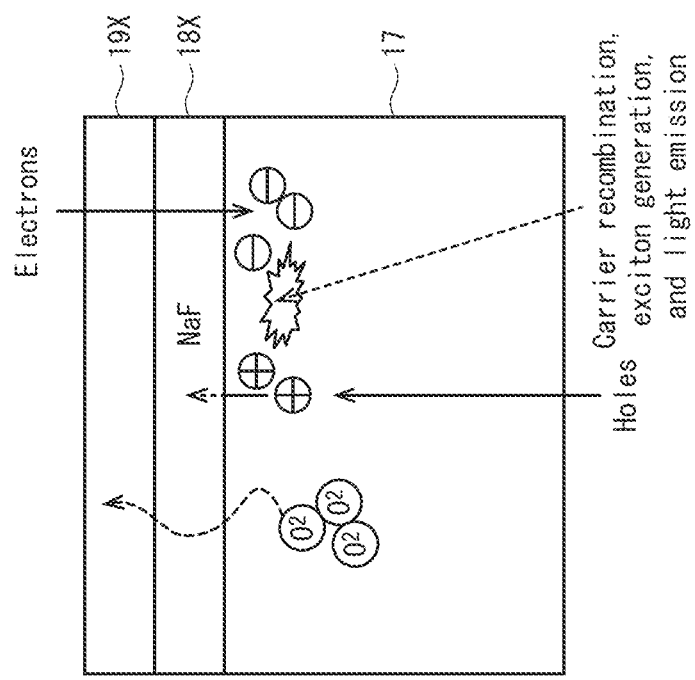

FIG. 14A and FIG. 14B are schematic diagrams illustrating layered structures of main parts (parts from an anode to a cathode, hereinafter referred to also as light-emitting parts) of conventional organic EL elements 2X and 2Y described in International Publication No. WO2015/194189 and Japanese Patent Application Publication No. 2007-36175, respectively. FIG. 15A and FIG. 15B are diagrams for explaining operations of the organic EL elements 2X and 2Y, respectively.

As illustrated in FIG. 14A, the organic EL elements 2X include light-emitting parts which are formed by layering, on pixel electrodes 13, hole injection layers 15, hole transport layers 16, organic light-emitting layers 17, an intermediate layer 18X which is formed from a material having high electron injection properties, an electron injection transport layer 19X, and a counter electrode 20 in this order. The intermediate layer 18X is an intermediate layer formed from an alkali metal fluoride, such as a layer formed from a metallic compound such as sodium fluoride. The electron injection transport layer 19X, which is adjacent to the intermediate layer 18X on the cathode side, includes a metallic element M1 as a dopant. The metallic element M1 is selected from alkali metals or alkali earth metals and has a low work function, such as barium, cesium, and lithium. The intermediate layer 18X has electron injection properties which are improved owing to the metallic element M1 of the electron injection transport layer 19X exerting a reduction action of the alkali metal fluoride of the intermediate layer 18X to cause partial dissociation of alkali metal.

Typically, the organic light-emitting layers 17 have properties of easily absorbing and transmitting moisture. Also, the metallic element M1 has active properties, and tends to react with moisture etc. inside the light-emitting layers 17 to cause deterioration in characteristics and thus reduction in element operating life.

In response to this problem, according to the organic EL elements 2X, the intermediate layer 18X, which is formed from the alkali metal fluoride, is provided between the electron injection transport layer 19X and the organic light-emitting layers 17. With this structure, moisture etc. inside the organic light-emitting layers 17 is prevented from penetrating through the electron injection transport layer 19X, thereby increasing an environmental resistance. Also, the metallic element M1 included in the electron injection transport layer 19X exerts the reduction action of part of the metallic compound included in the intermediate layer 18X to cause partial dissociation into alkali metal, thereby increasing the electron injection properties from the intermediate layer 18X to the organic light-emitting layers 17.

According to a study made by the present inventor, as illustrated in FIG. 15A, since the organic EL elements 2X includes, as a cathode-side layer adjacent to the organic light-emitting layers 17, the intermediate layer 18X including the material having the electron injection properties higher than that of a hole block layer 18Y described later, the properties of electron injection to the organic light-emitting layers 17 are increased and thus a shortage of electrons inside the light-emitting layers is suppressed.

However, the intermediate layer 18X, which is provided as a cathode-side layer adjacent to the organic light-emitting layers 17 in the organic EL elements 2X, has a smaller absolute value of the HOMO level than the hole block layer 18Y. This exhibits insufficient properties of blocking holes and excitons from the organic light-emitting layers 17 to the electron injection transport layer 19X. Further, according to the study made by the present inventor, it is considered that owing to the reduction action of the part of the metallic compound included in the intermediate layer 18X by the metallic element included in the electron injection transport layer 19X, the intermediate layer 18X exhibits deteriorated properties of blocking holes and excitons. It is assumed that low hole block properties cause reduction of element operating life. Specifically, low hole block properties cause holes to intrude into the electron injection transport layer 19X to combine with electrons inside the electron injection transport layer 19X and thus to generate excitons. This deteriorates the electron injection transport layer 19X and thus the element operating life reduces. Meanwhile, it is also assumed that low exciton block properties cause reduction of element operating life. Specifically, low exciton block properties cause the excitons generated in the organic light-emitting layers 17 to diffuse in the electron injection transport layer 19X. This deteriorates the electron injection transport layer 19X, and thus the element operating life reduces.

In addition, owing to inclusion of the metallic compound in the intermediate layer 18X, moisture etc. inside the organic light-emitting layers 17 is prevented from penetrating through the electron injection transport layer 19X thereby to increase the environmental resistance. However, it is feared that owing to the reduction action of the part of the metallic compound included in the intermediate layer 18X by the metallic element included in the electron injection transport layer 19X, the metallic compound dissociates thereby to deteriorate the environmental resistance of the intermediate layer 18X.

Compared with this, as illustrated in FIG. 14B, the organic EL elements 2Y include light-emitting parts which are formed by layering, on pixel electrodes 13, hole injection layers 15, hole transport layers 16, organic light-emitting layers 17, the hole block layer (HBL) 18Y, an electron injection transport layer 19Y, and a counter electrode 20.

As illustrated in FIG. 15B, since the organic EL elements 2Y include, as a cathode-side layer adjacent to the light-emitting layers 17, the hole block layer 18Y having a larger absolute value of the HOMO level than the organic light-emitting layers 17, movement of holes and excitons from the light-emitting layers 17 to the electron injection transport layer 19Y is blocked. This helps to keep holes inside the organic light-emitting layers 17 to increase a percentage of holes which combine with electrons, and also helps to efficiently convert energy of excitons into light.

However, the hole block layer 18Y which includes an organic material has an insufficient function of preventing moisture etc. inside the organic light-emitting layers 17 from penetrating through the electron injection transport layer 19Y to increase an environmental resistance. Due to this, it is assumed that the electron injection transport layer 19Y which is active deteriorates, electron injection properties deteriorate, and a carrier balance deteriorates, and thus an element operating life reduces.

In the case where organic EL elements are manufactured by a wet process according to which a solution containing an organic material and a solvent for forming organic layers which can be reduced in cost (hereinafter, such a solution is referred to simply as ink) is applied by a printing device, a residual amount of moisture in the organic layers is much larger than the case where organic EL elements are manufactured by a dry process such as vapor deposition. Accordingly, especially in such organic EL elements manufactured by the wet process, it is feared that the moisture in the organic layers which are lower layers penetrates through the electron injection transport layer, and reacts with alkali metal or the like included in the electron injection transport layer, and thus luminous properties significantly deteriorate. In view of this, there has been a demand for a further improvement in environmental resistance for organic EL elements including light-emitting layers which are applied films.

In order to solve the above problem, the present inventor earnestly conducted researches for achieving a layered structure of organic EL elements which exhibit hole block properties, electron injection properties, and environmental resistance thereby to have an improved element operating life. As a result, the present inventor arrived at an organic EL element and an organic EL display panel pertaining to at least one aspect of the present disclosure.

In view of the above circumstances, the present disclosure aims to provide a self-luminous element and a self-luminous display panel which exhibit hole block properties, electron injection properties, and environmental resistance and thus have an improved element operating life.

A self-luminous EL element pertaining to at least one aspect of the present disclosure is a self-luminous element including: a pixel electrode; a light-emitting layer that is disposed above the pixel electrode and includes a light-emitting material; a first functional layer that is disposed on the light-emitting layer and includes a metal fluoride; a second functional layer that is disposed on the first functional layer and includes a first organic material having at least one of electron transport properties and electron injection properties; and a counter electrode that is disposed above the second functional layer. The second functional layer does not include at least one metallic element selected from the group consisting of alkali metals, alkaline earth metals, and rare earth metals that reduce the metal fluoride. Also, according to another aspect, the metal fluoride is a fluoride of a metal selected from alkali metals, alkaline earth metals, or rare earth metals. Further, according to another aspect, the metal fluoride is a sodium fluoride.

These structures help to prevent the metallic element, which reduces the metal fluoride such as sodium fluoride, from affecting the first functional layer to cause reduction of the metal fluoride such as sodium fluoride included in the first functional layer and thus partial dissociation into sodium. Thus, deterioration in hole block properties can be prevented. At the same time, properties of injecting electrons from the first functional layer to the light-emitting layer can be improved. With this, the hole block properties and the electron injection properties are achieved, and thus a carrier balance in the light-emitting layer can be improved.

Also, by preventing dissociation of sodium fluoride included in the first functional layer, moisture etc. inside the light-emitting layer can be prevented from penetrating through the second functional layer, thereby improving an environmental resistance. This helps to achieve a self-luminous element and a self-luminous display panel which exhibit hole block properties, electron injection properties, and an environmental resistance thereby to have an improved element operating life.

Also, according to another aspect, the group consists of barium, lithium, cesium, and ytterbium.

This structure helps to embody a self-luminous element which achieves hole block properties and electron injection properties and thus has an improved carrier balance in a light-emitting layer to have an improved element operating life.

Also, according to another aspect, the first functional layer has a film thickness of 5 nm or smaller.

This structure helps to steeply increase the element operating life, compared with the case where the first functional layer has the film thickness outside the above range.

Also, according to another aspect, the first functional layer has the film thickness from 1 nm to 5 nm.

This structure helps to further increase the element operating life.

Also, according to another aspect, the second functional layer has a film thickness from 5 nm to 30 nm.

This structure helps to prevent a metallic element included in a third functional layer (electron injection transport layer) from affecting the first functional layer, reducing sodium fluoride included in the first functional layer, and also to improve the properties of injecting electrons from the first functional layer to the light-emitting layer.

Also, according to another aspect, the first functional layer has a film thickness equal to or smaller than a film thickness of the second functional layer.

This structure helps to achieve the electron injection properties of the first functional layer.

Also, according to another aspect, the self-luminous element further includes a third functional layer that is disposed on the second functional layer and below the counter electrode, and includes a second organic material doped with at least one metallic element selected from alkali metals, alkaline earth metals, or rare earth metals, the second organic material having at least one of electron transport properties and electron injection properties. Also, according to another aspect, the self-luminous element further includes a third functional layer that is disposed on the second functional layer and below the counter electrode, and includes at least one metallic element selected from alkali metals, alkaline earth metals, or rare earth metals. Further, according to another aspect, the metallic element included in the third functional layer is ytterbium.

With these structures, since the second functional layer (electron transport layer), which does not include the metallic element reducing a metal fluoride such as sodium fluoride, is provided, the metallic element included in the third functional layer (electron injection transport layer) does not affect the sodium fluoride included in the first functional layer. Accordingly, an amount of the metallic element in the third functional layer can be set to be optimal for the electron injection properties of the electron transport properties of the third functional layer. With no need to determine the amount of the metallic element included in the third functional layer taking into consideration of reduction of the metal fluoride included in the first functional layer, the electron injection properties and the electron transport properties of the third functional layer can be further increased.

Also, according to another aspect, the metallic element included in the third functional layer differs from a metallic element included in the first functional layer.

This structure helps to achieve the first functional layer formed from sodium fluoride.

Also, according to another aspect, the pixel electrode is light-reflective, and the counter electrode is light-semitransmissive.

This structure helps to achieve a self-luminous element of a top-emission type.

Also, according to another aspect, the self-luminous element further includes a fourth functional layer that is disposed above the pixel electrode and below the light-emitting layer, and includes an organic material having at least one of hole transport properties and hole injection properties.

This structure helps to improve at least one of the properties of injecting holes from the pixel electrode and the properties of transporting holes from the pixel electrode, thereby promoting supply of holes to the light-emitting layer to achieve a high efficiency.

Also, according to another aspect, at least one of the light-emitting layer and the fourth functional layer has a film thickness varying depending on a wavelength of light emitted from the light-emitting layer.

This structure facilitates construction of optical cavity structure, and thus an improvement in luminous efficiency is expected.

Also, according to another aspect, at least one of the light-emitting layer and the fourth functional layer is an applied film.

This structure helps to reduce manufacturing costs by employing a wet process. Film formation by the wet process causes a larger residual amount of impurities such as moisture than film formation by a dry process. However, sodium fluoride included in the first functional layer suppresses deterioration of the second functional layer and the third functional layer caused by the residual moisture, thereby achieving an increased operating life.

A self-luminous display panel pertaining to at least one aspect of the present disclosure is a self-luminous display panel in which self-luminous elements are arranged in a matrix of rows and columns above a substrate. The self-luminous elements each include: a pixel electrode; a light-emitting layer that is disposed above the pixel electrode and includes a light-emitting material; a first functional layer that is disposed on the light-emitting layer and includes a metal fluoride; a second functional layer that is disposed on the first functional layer and includes a first organic material having at least one of electron transport properties and electron injection properties; a counter electrode that is disposed above the second functional layer; banks extending in a column direction to partition between the light-emitting layers of the self-luminous elements arranged in a row direction. The second functional layer does not include at least one metallic element selected from the group consisting of alkali metals, alkaline earth metals, and rare earth metals that reduce the metal fluoride.

This structure helps to embody a self-luminous display panel which achieves hole block properties and electron injection properties and thus has an improved carrier balance in a light-emitting layer to have an improved element operating life.

The following describes an organic EL element and an organic EL display panel as a self-luminous element and a self-luminous display panel respectively pertaining to at least one aspect of the present disclosure and an organic EL display device including the self-luminous element and the self-luminous display panel, with reference to the drawings. Note that the drawings may be schematic, and are not necessarily to scale.

1. Overall Structure of Organic EL Display Device 1

Figure 1:
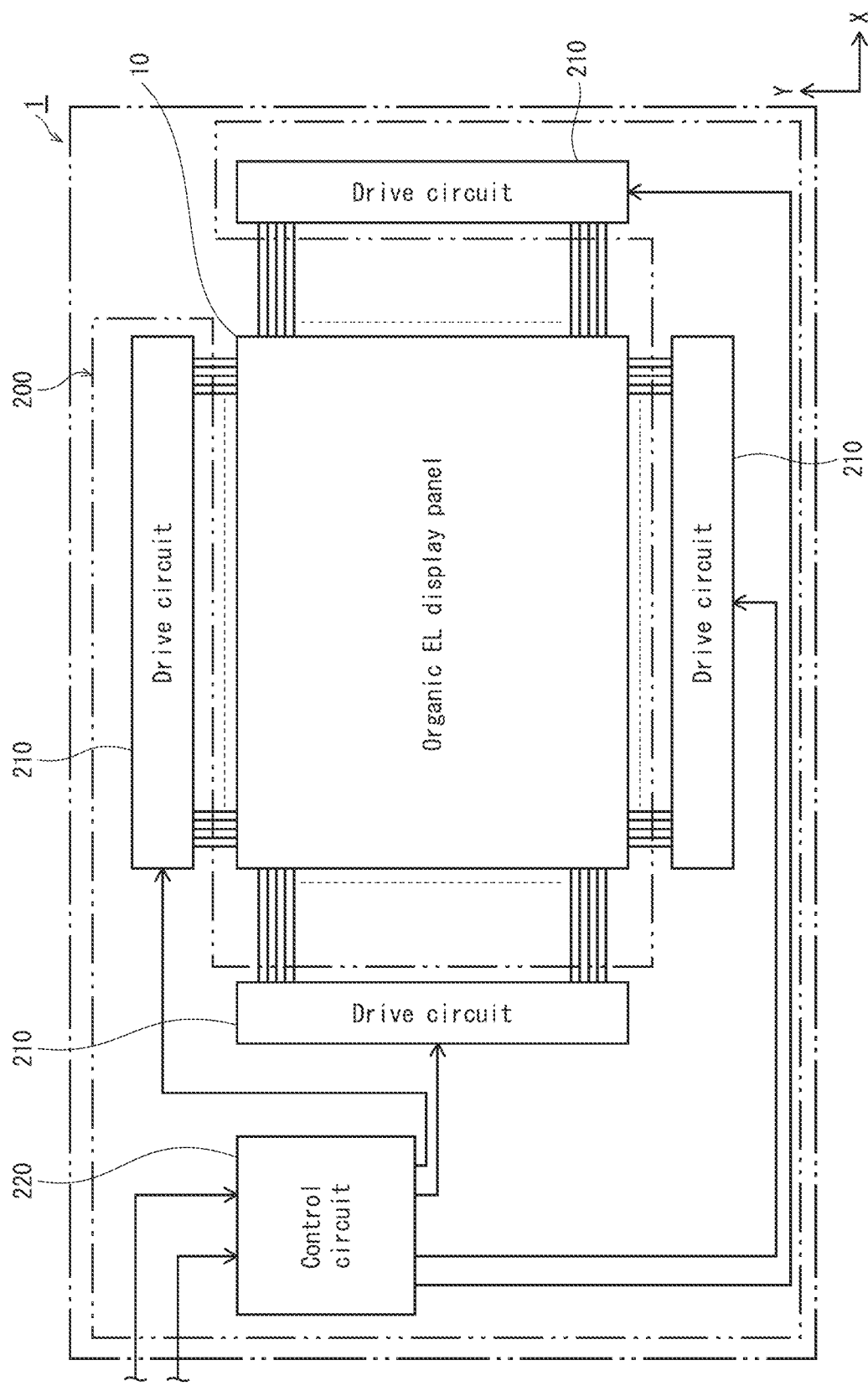
FIG. 1 is a block diagram illustrating the overall structure of an organic EL display device pertaining to at least one embodiment of the present disclosure.

FIG. 1 a block diagram illustrating an overall structure of an organic EL display device 1 pertaining to at least one embodiment. The organic EL display device 1 is a display device which is used for example for a television, a personal computer, a mobile terminal, or a display for business purposes such as an electronic signboard and a large screen for a commercial facility.

The organic EL display device 1 includes an organic EL display panel 10 (hereinafter, referred to simply as display panel 10) and a drive controller 200 which is electrically connected to the display panel 10.

According to the present embodiment, the display panel 10 is a top emission type display panel, a top surface of which is a rectangular image display surface. In the display panel 10, a plurality of organic EL elements (not illustrated) are arranged across the image display surface, and an image is displayed by combining light emission of the organic EL elements. As an example, the display panel 10 employs an active matrix system.

The drive controller 200 includes drive circuits 210 connected to the display panel 10 and a control circuit 220 connected to an external device such as a computer or a receiving device such as an antenna. The drive circuits 210 include power supply circuits for supplying electric power to the organic EL elements, signal circuits for applying a voltage signal for controlling the electric power supplied to the organic EL elements, a scanning circuit for switching a position to which the voltage signal is applied at regular intervals, and the like.

The control circuit 220 controls operations of the drive circuits 210 in accordance with data including image information input from the external device or the receiving device.

In FIG. 1, as an example, four of the drive circuits 210 are disposed around the display panel 10, but the structure of the drive controller 200 is not limited to this example, and the number and position of the drive circuits 210 may be modified as appropriate. For the sake of explanation, as illustrated in FIG. 1, a direction along a long side of a top surface of the display panel 10 is referred to as X direction and a direction along a short side of the top surface of the display panel 10 is referred to as Y direction.

2. Structure of Display Panel 10

(A) Plan View Structure

FIG. 2 is a schematic enlarged plan view illustrating part of the image display surface of the display panel 10 pertaining to at least one embodiment. According to the display panel 10, as an example, subpixels 100R, 100G, and 100B which respectively emit light of red (R), green (G), and blue (B) colors (hereinafter, also referred to simply as R, G, and B) are arranged in a matrix. The subpixels 100R, 100G, and 100B are lined up alternating in the X direction, and a set of the subpixels 100R, 100G, and 100B in the X direction constitute one pixel P. Through combining gradation control of luminance of the subpixels 100R, 100G, and 100B, full color is possible.

In addition, in the Y direction, the subpixels 100R, 100G, and 100B are arranged to form subpixel columns CR, CG, and CB, respectively, in which only the corresponding color of subpixels are present. As a result, across the display panel 10, the pixels P are arranged in a matrix along the X direction and the Y direction, and an image is displayed on the image display surface through a combination of colors of light emitted by the pixels P.

Figure 3:
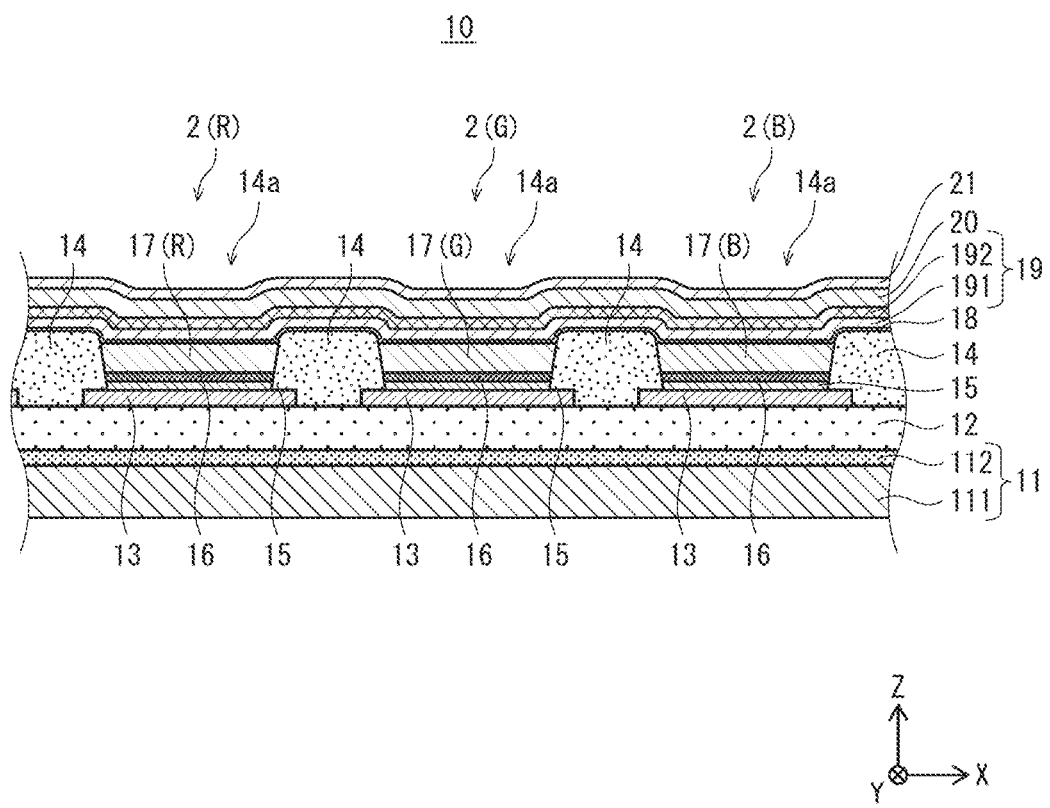
FIG. 3 is a schematic cross-section diagram, taken along a line A-A in FIG. 2, pertaining to at least one embodiment of the present disclosure.
Figure 4:
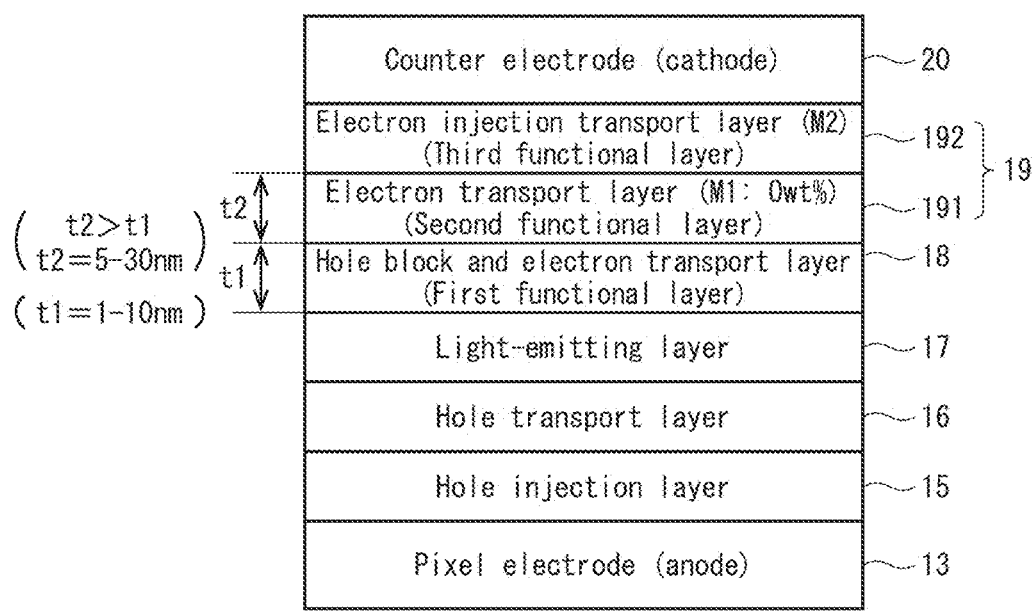
FIG. 4 is a diagram illustrating a layered structure of organic EL elements 2 pertaining to at least one embodiment of the present disclosure.

In the subpixels 100R, 100G, and 100B, organic EL elements 2(R), 2(G), and 2(B), which respectively emit light of the R, G, and B colors, are respectively arranged (see FIG. 3).

Also, the display panel 10 pertaining to the present embodiment employs a so-called line bank structure. In other words, the subpixel columns CR, CG, and CB are partitioned by banks 14 at intervals in the X direction, and in each of the subpixel columns CR, CG, and CB, the subpixels 100R, 100G, or 100B therein share a continuous organic light-emitting layer.

However, in each of the subpixel columns CR, CG, and CB, pixel partition layers 141 are disposed at intervals in the Y direction to insulate the subpixels 100R, 100G, and 100B from each other, such that each of the subpixels 100R, 100G, and 100B can emit light independently.

Note that the pixel partition layers 141 have a height lower than a height of liquid surfaces of an ink applied for light-emitting layer formation. The banks 14 and the pixel partition layers 141 are indicated by dotted lines in FIG. 2. This is because the banks 14 and the pixel partition layers 141 are not exposed on the surface of the image display surface and are disposed inside the image display surface.

(B) Cross-Section Structure

FIG. 3 is a schematic cross-section diagram, taken along a line A-A in FIG. 2, pertaining to at least one embodiment. The display panel 10 includes pixels which are each composed of three subpixels each emitting light of a different one of the R, G, and B colors. The three subpixels are each composed of an organic EL element 2(R), 2(G), or 2(B) emitting light of a corresponding color.

The organic EL elements 2(R), 2(G), and 2(B), which respectively emit light of the R, G, and B colors, basically have the same structure, and thus are referred collectively to as organic EL elements 2 when they are not distinguished from one another.

As illustrated in FIG. 3, the organic EL elements 2 include a substrate 11, an interlayer insulating layer 12, pixel electrodes 13 (anodes), banks 14, hole injection layers 15, hole transport layers 16, light-emitting layers 17, a hole block and electron transport layer 18 (first functional layer), an electron transport layer 191 (second functional layer), an electron injection transport layer 192 (third functional layer), a counter electrode 20 (cathode), and a sealing layer 21.

The substrate 11, the interlayer insulating layer 12, the hole block and electron transport layer 18 (first functional layer), the electron transport layer 191 (second functional layer), the electron injection transport layer 192 (third functional layer), the counter electrode 20, and, the sealing layer 21 are formed not for each pixel but across all the organic EL elements 2 included in the display panel 10.

(1) Substrate

The substrate 11 includes a base material 111 which is an insulating material and a thin film transistor (TFT) layer 112. The TFT layer 112 has a driving circuit formed therein for each subpixel. The base material 111 is for example a glass substrate, a quartz substrate, a silicon substrate, or a metal substrate including molybdenum sulfide, copper, zinc, aluminum, stainless, magnesium, iron, nickel, gold, and silver, a semiconductor substrate including gallium arsenide, or a plastic substrate.

Either thermoplastic resin or thermosetting resin is usable as a plastic material. The plastic material may be for example a laminate of any one type or any two or more types of the following materials, including polyethylene, polypropylene, polyamide, polyimide (PI), polycarbonate, acrylic resin, polyethylene terephthalate (PET), polybutylene terephthalate, polyacetal, other fluororesin, thermoplastic elastomer such as styrene elastomer, polyolefin elastomer, polyvinyl chloride elastomer, polyurethane elastomer, fluorine rubber elastomer, and chlorinated polyethylene elastomer, epoxy resin, unsaturated polyester, silicone resin, polyurethane, or copolymer, blend, polymer alloy or the like mainly including such a material described above.

(2) Interlayer Insulating Layer

The interlayer insulating layer 12 is formed on the substrate 11. The interlayer insulating layer 12 includes a resin material and is for flattening irregularities in a top surface of the TFT layer 112. The resin material is for example a positive photosensitive material. Examples of the photosensitive material include acrylic resin, polyimide resin, siloxane resin, and phenolic resin. Also, although not illustrated in the cross-section in FIG. 3, the interlayer insulating layer 12 has a contact hole provided therein for each subpixel.

(3) Pixel Electrodes

The pixel electrodes 13 include metal layers including a light-reflective metal material, and are formed on the interlayer insulating layer 12. The pixel electrode 13 is formed for each subpixel, and is electrically connected with the TFT layer 112 via a contact hole (not illustrated). In the present embodiment, the pixel electrode 13 functions as an anode.

Specific examples of the light-reflective metal material include silver (Ag), aluminum (Al), alloy of aluminum, molybdenum (Mo), alloy of silver, palladium, and copper (APC), alloy of silver, rubidium, and gold (ARA), alloy of molybdenum and chromium (MoCr), alloy of molybdenum and tungsten (MoW), and alloy of nickel and chromium (NiCr).

In at least one embodiment, the pixel electrodes 13 are single metal layers. In at least one embodiment, the pixel electrodes 13 have a layered structure including a metal oxide layer such as an indium tin oxide (ITO) layer and an indium zinc oxide (IZO) layer layered on a metal layer.

(4) Banks and Pixel Partition Layers

The banks 14 partition the pixel electrodes 13 corresponding to the subpixels on the substrate 11 into columns in the X direction (see FIG. 2), and each have a line bank shape extending in the Y direction between the subpixel columns CR, CG, and CB in the X direction.

An electrically-insulating material is used for the banks 14. Specific examples of the electrically-insulating material include an insulating organic material such as acrylic resin, polyimide resin, novolac resin, and phenolic resin.

In the case where the light-emitting layers 17 are formed by an application method, the banks 14 function as a structure for preventing an ink mixture between subpixels in each pixel.

From the viewpoint of workability, in at least one embodiment, when a resin material is used for the banks 14, a photosensitive resin material is used. Photosensitivity of the resin material may be either positive or negative.

In at least one embodiment, the banks 14 are resistant to organic solvents and heat. Also, in at least one embodiment, the banks 14 have liquid-repellent surfaces in order to suppress an ink overflow.

Where the pixel electrodes 13 are not formed, bottom surfaces of the banks 14 are in contact with a top surface of the interlayer insulating layer 12.

The pixel partition layers 141 include an electrically-insulating material, and cover end parts in the Y direction (FIG. 2) of the pixel electrodes 13 in each sub pixel column, partitioning the pixel electrodes 13 in the Y direction.

Film thickness of the pixel partition layers 141 is set to be slightly larger than film thickness of the pixel electrodes 13 but to be smaller than film thickness of the light-emitting layers 17 including their top surfaces. Thus, the light-emitting layers 17 in the subpixel columns CR, CG, and CB are not partitioned by the pixel partition layers 141, and accordingly flow of ink is not disturbed when forming the light-emitting layers 17. This facilitates the film thickness of each of the light-emitting layers 17 to be uniform within the corresponding subpixel column.

With the structure described above, the pixel partition layers 141 improve electrical insulation between the pixel electrodes 13 in the Y direction and also have functions of suppressing discontinuity of the light-emitting layers 17 within any given one of the subpixel columns CR, CG, and CB, improving electrical insulation between the pixel electrodes 13 and the counter electrode 20, and so on.

Specific examples of the electrically-insulating material used for the pixel partition layers 141 include a resin material exemplified as the material of the banks 14 and an inorganic material. Also, in at least one embodiment, surfaces of the pixel partition layers 141 have lyophilic properties relative to an ink in order to facilitate ink spreading in forming the light-emitting layers 17 which are to be upper layers of the pixel partition layers 141.

(5) Hole Injection Layers

The hole injection layers 15 are provided inside openings 14a on the pixel electrodes 13 in order to promote injection of holes from the pixel electrodes 13 to the light-emitting layers 17. The hole injection layers 15 include for example oxide of metal such as silver (Ag), molybdenum (Mo), chromium (Cr), vanadium (V), tungsten (W), nickel (Ni), and iridium (Ir), or an electrically-conductive polymer material such as poly(3,4-ethylenedioxythiophene) polystyrene sulfonate (PEDOT:PSS). The hole injection layers 15, when including a metal oxide described above, have a function of stably injecting holes or assisting hole generation, thus injecting the holes to the light-emitting layers 17. In the present embodiment, the hole injection layers 15 are formed from an electrically-conductive polymer material such as poly(3,4-ethylenedioxythiophene) polystyrene sulfonate (PEDOT:PSS) by a wet process such as a printing method.

(6) Hole Transport Layers

The hole transport layers 16 have a function of transporting holes injected from the hole injection layers 15 to the light-emitting layers 17. Examples of a material of the hole transport layers 16 include arylamine derivative, triazole derivative, oxadiazole derivative, imidazole derivative, polyarylalkane derivative, pyrazoline derivative and pyrazolone derivative, phenylenediamine derivative, amino-substituted chalcone derivative, oxazole derivative, styrylanthracene derivative, fluorenone derivative, hydrazone derivative, stilbene derivative, butadiene compound, polystyrene derivative, hydrazone derivative, triphenylmethane derivative, or tetraphenylbenzene derivative, or any combination of these materials.

Also, in at least one embodiment, the hole transport layers 16 are formed by a wet process using for example a high-molecular compound having no hydrophilic group such as polyfluorene, polyfluorene derivative, polyallylamine, and polyallylamine derivative.

(7) Organic Light-emitting Layers

The light-emitting layers 17 are formed inside the openings 14a, and each have a function of emitting light of R, G, or B color owing to recombination of holes and electrons. In particular, when it is necessary to specify the light emission color for explanation, the light-emitting layers 17 are referred to as the light-emitting layers 17(R), 17(G), and 17(B) separately.

Publicly-known materials are usable for an organic light-emitting material of the light-emitting layers 17. Examples of the organic light-emitting material of the light-emitting layers 17 include phosphor such as oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylenepyran compound, dicyanomethylenethiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, and metal complex of 8-hydroxyquinoline compound, metal complex of 2-bipyridine compound, complex of a Schiff base and group III metal, oxine metal complex, and rare earth complex. Also, in at least one embodiment, the organic light emitting material of the light emitting layers 123 is a known phosphorescent substance including metal complex such as tris (2-phenylpyridine) iridium.

(8) Hole Block and Electron Transport Layer (First Functional Layer)

A hole block and electron transport layer 18 has a function of blocking movement of holes and excitons from the light-emitting layers 17 to the electron transport layer 191 and a function of transporting electrons from the counter electrode 20 to the light-emitting layers 17. Also, the hole block and electron transport layer 18 has a function of preventing holes, which are injected from the pixel electrode 13, from being injected to the electron transport layer 191 through the light-emitting layers 17 without contributing to recombination, thereby keeping the holes inside the light-emitting layers 17. Further, the hole block and electron transport layer 18 has a function of preventing transfer of an excitation energy generated in the light-emitting layers 17 to molecules inside the electron transport layer 191. These functions help to suppress deterioration in luminous efficiency and reduction in element operating life.

The hole block and electron transport layer 18 is a first functional layer which is disposed adjacent to the light-emitting layers 17 on the cathode side and is formed by depositing a metal fluoride such as sodium fluoride (NaF) by a deposition method.

The hole block and electron transport layer 18 is formed from sodium fluoride so as to have a predefined film thickness, thereby improving electron transport properties. Also, reduction of sodium fluoride by metallic elements M1 and M2 which are described later is prevented, and accordingly is present as a compound in the hole block and electron transport layer 18. In this way, dissociation of sodium fluoride is prevented, thereby preventing deterioration in hole block properties.

Also, in at least one embodiment, as a metal fluoride other than sodium fluoride, a fluoride of a metal selected from alkali metals, alkaline earth metals, or rare earth metals is usable. Preferable examples of such a metal fluoride include ytterbium fluoride ($YbF_3$), lithium fluoride (LiF), and barium fluoride ($BaF_2$). In at least one embodiment, as an alkaline metal fluoride, cerium fluoride ($CeF_3$), lithium fluoride (LiF), or sodium fluoride (NaF) is usable. In at least one embodiment, as an alkaline earth metal fluoride, calcium fluoride ($CaF_2$), magnesium fluoride ($MgF_2$), or barium fluoride ($BaF_2$) is usable. In at least one embodiment, as a rare earth metal fluoride, lanthanum fluoride ($LaF_3$), neodymium fluoride ($NdF_3$), samarium fluoride ($SmF_3$), ytterbium fluoride ($YbF_3$), yttrium fluoride ($YF_3$), gadolinium fluoride ($GdF_3$), or the like is usable.

In at least one embodiment, the hole block and electron transport layer 18 has a film thickness of more than 0 nm and 5 nm or less. In at least one embodiment, the hole block and electron transport layer 18 has a film thickness from 1 nm to 5 nm. The hole block and electron transport layer 18 has the function of blocking movement of holes and excitons owing to including a predefined amount of sodium fluoride with the thickness of 1 nm or more. Also, the hole block and electron transport layer 18 has the function of improving the properties of injecting electron to the light-emitting layers 17 owing to including the predefined amount of sodium fluoride with the thickness of 5 nm or smaller.

Figure 5B:
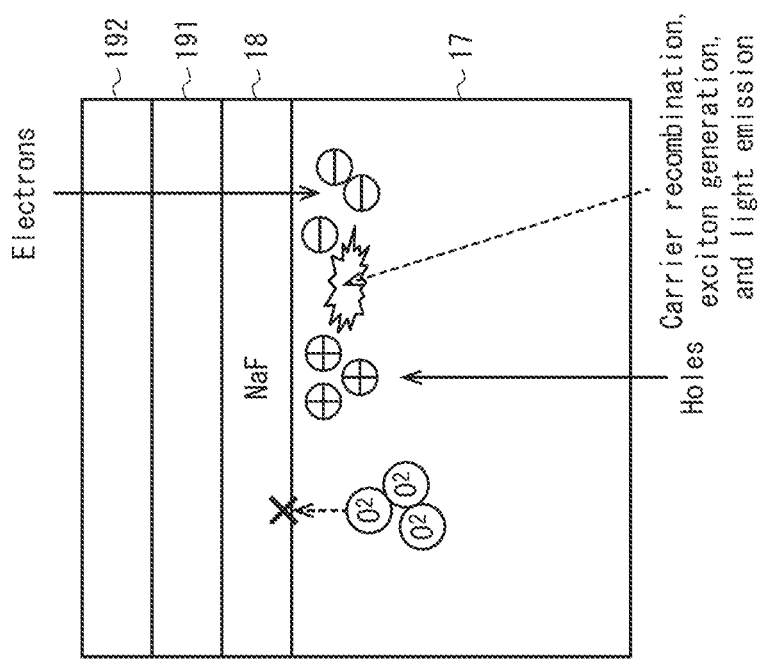
FIG. 5B is a diagram for explaining operations of the organic EL elements 2.
Figure 5A:
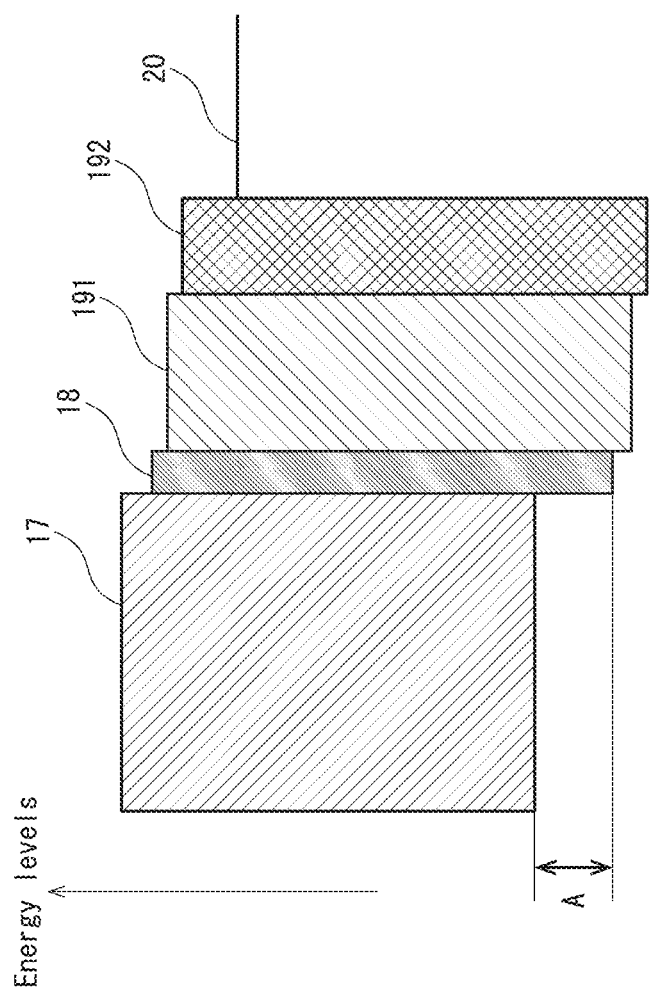
FIG. 5A is a schematic diagram illustrating energy levels of light-emitting layers, a hole block and electron transport layer, and an electron transport layer of the organic EL elements 2 pertaining to at least one embodiment of the present disclosure.

In other words, the hole block and electron transport layer 18 can optimize movement of carriers between the light-emitting layers and the adjacent layer. FIG. 5A is a schematic diagram illustrating energy levels of the light-emitting layers, the hole block and electron transport layer, the electron transport layer, and the electron injection transport layer of the organic EL elements 2 pertaining to at least one embodiment. FIG. 5B is a diagram for explaining operations of the organic EL elements 2.

The hole block and electron transport layer 18 is lower than the light-emitting layers 17 in terms of HOMO level of a compositional material (higher than the light-emitting layers 17 in terms of absolute value of the HOMO level), and accordingly has a function of blocking movement of holes and excitons from the light-emitting layers 17 to the electron transport layer 191. Specifically, by setting the absolute value of the HOMO level of the organic material constituting the hole block and electron transport layer 18 to 6.0 eV or higher, a difference in HOMO level (part A in FIG. 5A) between molecules included in the hole block and electron transport layer 18 and molecules included in the light-emitting layers 17 is set to 0.2 eV or higher, and preferably to 0.5 eV or higher. This structure helps to block movement of holes and excitons from the light-emitting layers 17 to the electron transport layer 191, as illustrated in FIG. 5B. This helps to suppress: an occurrence that holes intrude into the electron injection transport layer 192, combine with electrons inside the electron injection transport layer 192 to generate excitons, thereby deteriorating the electron injection transport layer 192; or an occurrence that excitons generated in the light-emitting layers 17 diffuse in the electron injection transport layer 192 to deteriorate the electron injection transport layer 192, thereby reducing the element operating life.

Further, as illustrated in FIG. 5B, it is possible to suppress partial dissociation of sodium fluoride included in the hole block and electron transport layer 18 into sodium exerted by a metallic element included in the electron injection transport layer 192, thereby suppressing a deterioration in hole block properties and environmental resistance of the hole block and electron transport layer 18.

Moreover, as described above, by setting the hole block and electron transport layer 18 to have the film thickness of 5 nm or smaller, it is possible to improve the properties of injecting electrons from the hole block and electron transport layer 18 to the light-emitting layers 17, as illustrated in FIG. 5B. This increases the properties of injecting electrons to the light-emitting layers 17 and improves a carrier balance in the light-emitting layers 17, thereby increasing the luminous efficiency. Accordingly, a current density necessary for exhibiting a predefined luminance reduces, and thus reduction in element operating life can be suppressed.

(9) Electron Transport Layer and Electron Injection Transport Layer (9-1) Electron Transport Layer (Second Functional Layer)

The electron transport layer 191 has a function of transporting electrons from the counter electrode 20 to the light-emitting layers 17. The electron transport layer 191 is disposed adjacent to the hole block and electron transport layer 18 on the cathode side, and includes a first organic material having at least one of electron transport properties and electron injection properties. The first organic material (host material) is for example a π-electron low molecular organic material such as oxadiazole derivative (OXD), triazole derivative (TAZ), and phenanthroline derivative (BCP, Bphen), but is not limited to these materials.

Further, the electron transport layer 191 does not include at least one metallic element M1. The metallic element M1 is selected from the group consisting of alkali metals, alkaline earth metals, and rare earth metals that reduce a metal fluoride such as sodium fluoride included in the hole block and electron transport layer 18. The group, from which the metallic element M1, consists of for example barium, cesium, lithium, ytterbium, and the like. This structure prevents the metallic element M1, which reduces a metal fluoride such as sodium fluoride, from affecting the hole block and electron transport layer 18 to cause reduction of an alkali metal fluoride included in the hole block and electron transport layer 18 and thus partial dissociation into alkali metal. Here, even in the case where "at least one metallic element M1 is not included" as above, it is permissible that the electron transport layer 191 for example substantially includes the metallic element M1 to the extent that the alkali metal fluoride included in the hole block and electron transport layer 18 is not dissociated.

Moreover, by setting the electron transport layer 191 to have the film thickness of 5 nm or more, it is possible to suppress the metallic element M2 included in the electron injection transport layer 192 from affecting the hole block and electron transport layer 18 and reducing the alkali metal fluoride included in the hole block and electron transport layer 18. In addition, by setting the electron transport layer 191 to have the film thickness of 30 nm or smaller, it is possible to improve the properties of injecting electrons to the light-emitting layers 17.

(9-2) Electron Injection Transport Layer (Third Functional Layer)

The electron injection transport layer 192 has a function of injecting and transporting electrons supplied from the counter electrode 20 to the light-emitting layers 17. In at least one embodiment, the electron injection transport layer 192 includes a second organic material having electron transport properties which is doped with a metallic element M2 increasing electron transport properties.

The second organic material (host material) can be selected from organic materials similar to the above first organic material. The second organic material may be either a material the same as the first organic material or a material different from the first organic material.

As the metallic element M2, an alkali metal, an alkaline earth metal, or a rare earth metal is usable. Examples of the metallic element M2 include a metal having a low work function such as lithium, barium, calcium, potassium, cesium, and sodium, rubidium, a metal salt having a low work function such as a lithium fluoride and ytterbium, a metal oxide having a low work function such as barium oxide, and a metal organic complex having a low work function such as lithium quinolinol. Note that in the case where the electron injection transport layer 192 includes lithium quinolinol, this lithium quinolinol is sometimes present as lithium. Specifically, a reduction action of the metal material included in the counter electrode 20 sometimes exerts on the lithium quinolinol included in the electron injection transport layer 192 to cause dissociation into quinolinol.

Also, in at least one embodiment, the electron injection transport layer 192 consists of at least one metallic element selected from alkali metals, alkaline earth metals, or rare earth metals. In at least one embodiment, the metallic element is ytterbium.

Through the above process, a functional layer 19 is formed.

(10) Counter Electrode

The counter electrode 20 includes a light-transmissive and electrically-conductive material, and is formed on the electron injection transport layer 192. The counter electrode 20 functions as a cathode.

The counter electrode 20 can be formed by using for example a metal thin film or a light-transmissive and electrically-conductive film including for example ITO or IZO. In at least one embodiment, to obtain an optical cavity structure further effectively, the counter electrode 20 is a metal thin film including at least one material selected from the group consisting of aluminum, magnesium, silver, aluminum-lithium alloy, magnesium-silver alloy, and the like. In at least one embodiment, the metal thin film in this case has a film thickness from 5 nm to 30 nm. With this structure, the counter electrode 20 is light-semitransmissive, and accordingly an optical cavity structure can be constructed between a light-reflective surface of the pixel electrode 13 and a light-reflective surface of the counter electrode 20. This further improves the luminous efficiency.

In at least one embodiment, in the case where an optical cavity structure such as above is adopted, a light-transmissive and electrically-conductive film including for example ITO or IZO and having a desired film thickness is formed between the electron injection transport layer 192 and the counter electrode 20, such that an optical distance between the light-emitting layers 17 and the counter electrode 20 is adjusted to an appropriate length.

Also, in at least one embodiment, a light-transmissive and electrically-conductive film including for example ITO or IZO is formed on the counter electrode 20, thereby adjusting chromaticity and viewing angle.

(11) Sealing Layer

The sealing layer 21 is provided for preventing organic layers such as the hole transport layers 16, the light-emitting layers 17, and the electron injection transport layer 192 from being exposed to moisture, air, and so on and thus from being deteriorated.

The sealing layer 21 for example includes a light-transmissive material such as silicon nitride (SiN) and silicon oxynitride (SiON).

(12) Others

Although not illustrated in FIG. 3, in at least one embodiment, an antiglare polarizing plate or an upper substrate is attached onto the sealing layer 21 via a light-transmissive adhesive. Also, in at least one embodiment, a color filter for correcting chromaticity of light emitted from the organic EL elements 2 is attached. These structures help to further protect the hole transport layers 16, the light-emitting layers 17, the electron injection transport layer 192, and so on against external moisture, air, and so on.

3. Method of Manufacturing Organic EL Elements

Figure 6:
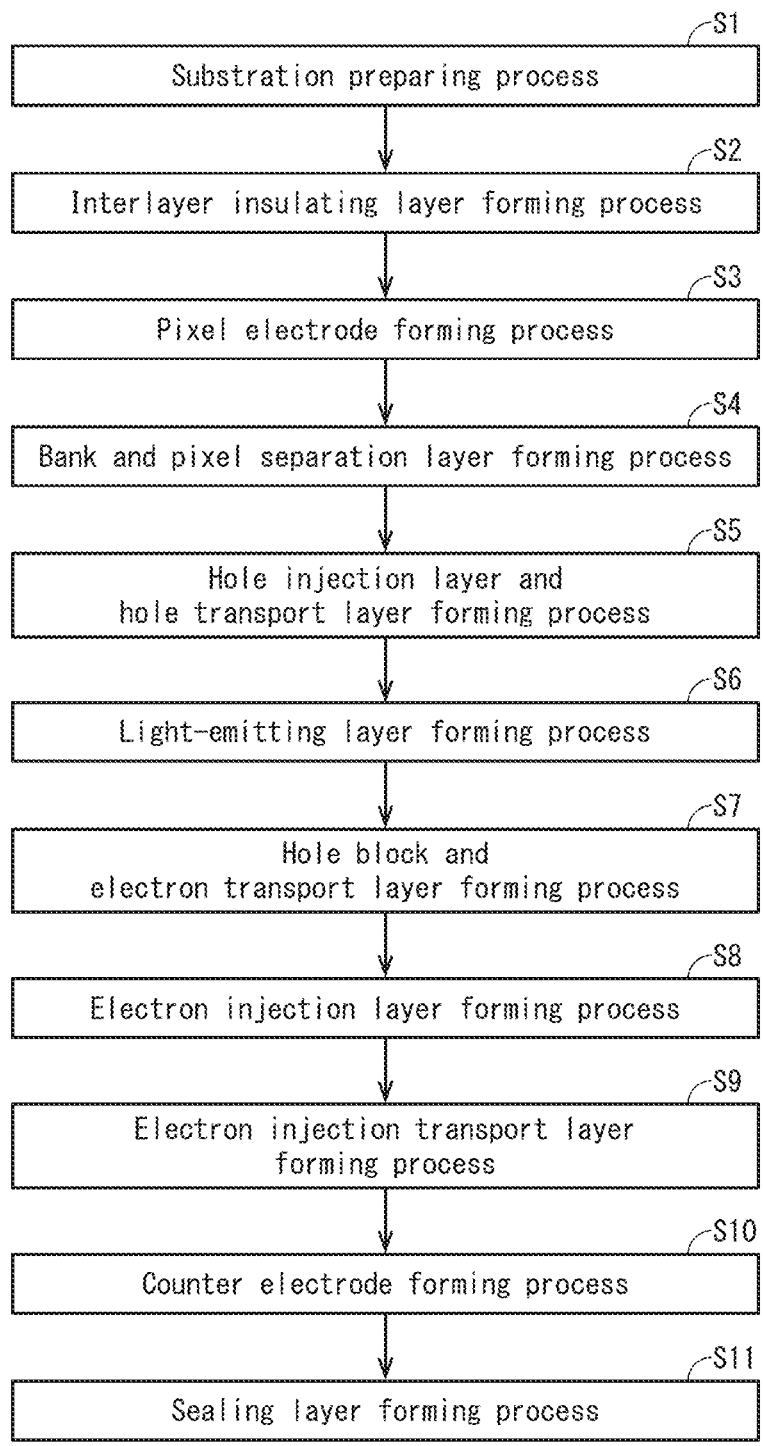
FIG. 6 is a flowchart illustrating a manufacturing process of the organic EL display panel pertaining to at least one embodiment of the present disclosure.

The following describes a method of manufacturing organic EL elements pertaining to at least one embodiment of the present disclosure, with reference to FIG. 6, FIG. 7A to FIG. 7D, FIG. 8A to FIG. 8D, FIG. 9A to FIG. 9B, and FIG. 10A to FIG. 10E. FIG. 6 is a flowchart illustrating manufacturing process of organic EL elements pertaining to at least one embodiment. FIG. 7A to FIG. 7D, FIG. 8A to FIG. 8D, FIG. 9A to FIG. 9B, and FIG. 10A to FIG. 10E are cross-section diagrams schematically illustrating the manufacturing process of the organic EL elements pertaining to at least one embodiment.

(1) Substrate Preparing Process

Figure 7A:
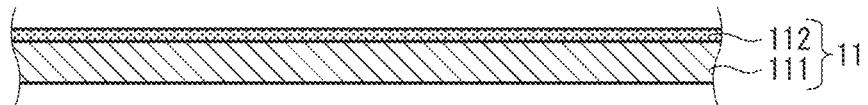
FIG. 7A to FIG. 7D are partial cross-section diagrams schematically illustrating the manufacturing process of the organic EL elements 2 pertaining to at least one embodiment of the present disclosure.

First, as illustrated in FIG. 7A, a substrate 11 is prepared by forming a TFT layer 112 on a base material 111 (FIG. 6: Step S1). The TFT layer 112 can be formed by a known TFT manufacturing method.

(2) Interlayer Insulating Layer Forming Process

Figure 7B:
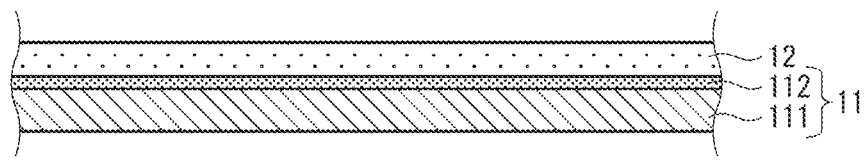

Next, as illustrated in FIG. 7B, an interlayer insulating layer 12 is formed on the substrate 11 (FIG. 6: Step S2).

Specifically, a resin material having a constant fluidity is applied across a top surface of the substrate 11 by for example die coating so as to fill irregularities in the substrate 11 caused by the TFT layer 112. Thus, a top surface of the interlayer insulating layer 12 has a flattened shape conforming to a top surface of the base material 111.

Also, dry-etching is performed on parts of the interlayer insulating layer 12 above TFT elements, for example source electrodes, to provide contact holes (not illustrated). The contact holes are provided by patterning or the like such that surfaces of the source electrodes are exposed at bottoms of the contact holes.

Next, connection electrode layers are formed along inner walls of the contact holes. Upper parts of the connection electrode layers are partially disposed on the interlayer insulating layer 12. The connection electrode layers can be formed by forming a metal film by for example sputtering, and then patterning the metal film by photolithography and wet etching.

(3) Pixel Electrode Forming Process

Figure 7C:
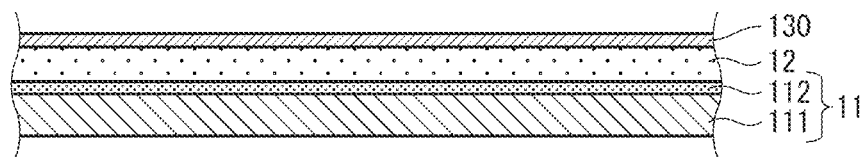

Next, as illustrated in FIG. 7C, a pixel electrode material layer 130 is formed on the interlayer insulating layer 12. The pixel electrode material layer 130 can be formed by vacuum deposition, sputtering, or the like.

Figure 7D:
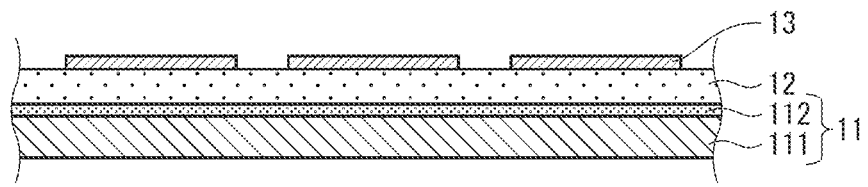

Then, as illustrated in FIG. 7D, the pixel electrode material layer 130 is patterned by etching to form a plurality of pixel electrodes 13 partitioned for each subpixel (FIG. 6: Step S3).

(4) Bank and Pixel Partition Layer Forming Process

Next, banks 14 and pixel partition layers 141 are formed (FIG. 6: Step S4).

In the present embodiment, the pixel partition layers 141 and the banks 14 are formed through separate processes.

(4-1) Pixel Partition Layer Formation

First, the pixel partition layers 141 extending in the X direction are formed so as to partition pixel electrode columns extending in the Y direction (FIG. 2) for each subpixel.

Figure 8A:
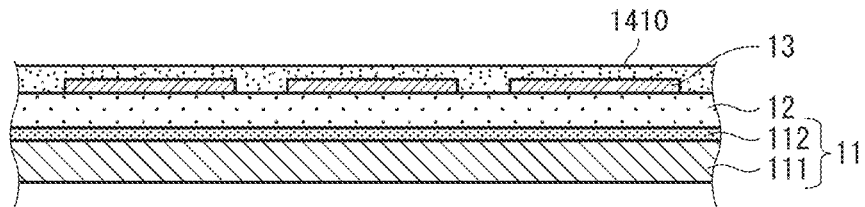
FIG. 8A to FIG. 8D are partial cross-section diagrams, continuing from FIG. 7D, schematically illustrating the manufacturing process of the organic EL elements 2 pertaining to at least one embodiment of the present disclosure.

As illustrated in FIG. 8A, a pixel partition layer material layer 1410 is formed by uniformly applying a photosensitive resin material which is a material of the pixel partition layers 141 onto the interlayer insulating layer 12 on which the pixel electrodes 13 are formed. Here, an application amount of the resin material has been determined in advance such that the pixel partition layer material layer 1410 after drying has a desired film thickness of the pixel partition layers 141.

A method of applying the resin material is specifically for example a wet process such as die coating, slit coating, and spin coating. In at least one embodiment, by for example vacuum drying and low-temperature heating at an approximate temperature of 60° C. to 120° C. (pre-baking) after application, an unnecessary solvent is removed, and also the pixel partition layer material layer 1410 is fixed onto the interlayer insulating layer 12.

Then, the pixel partition layer material layer 1410 is patterned by photolithography.

For example, in the case where the pixel partition layer material layer 1410 has positive photosensitivity, exposure is performed on the pixel partition layer material layer 1410 via a photomask (not illustrated). The photomask shields parts of the pixel partition layer material layer 1410 to remain as the pixel partition layers 141 against light and has light-transmissive parts corresponding to parts of the pixel partition layer material layer 1410 to be removed.

Next, developing is performed, and the exposed parts of the pixel partition layer material layer 1410 are removed. Thus, the pixel partition layers 141 are formed. Specific examples of developing methods include a method of immersing the entire substrate 11 in a developer such as an organic solvent and an alkaline solution which dissolves parts of the pixel partition layer material layer 1410 which have been exposed to light, and then rinsing the substrate 11 by a rinse solution such as pure water.

Figure 8B:
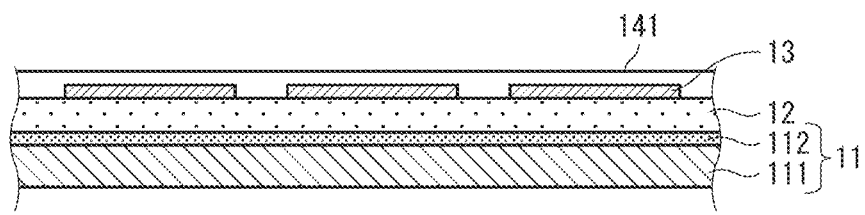

Then, the pixel partition layer material layer 1410 is baked (post-baked) at a predefined temperature. As a result, the pixel partition layers 141 extending in the X direction are formed on the interlayer insulating layer 12 (FIG. 8B).

(4-2) Bank Formation

Next, the banks 14 extending in the Y direction are formed in the same manner as the pixel partition layers 141 described above.

Figure 8C:
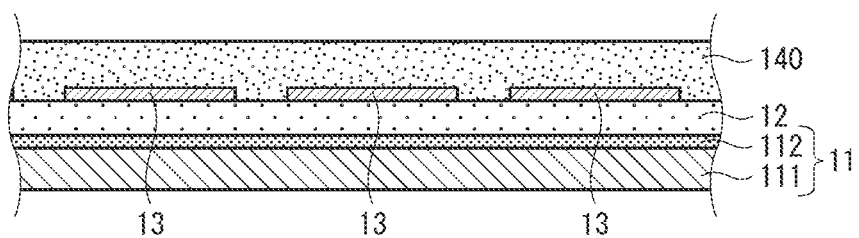

Specifically, a bank material layer 140 is formed by applying a resin material for banks by die coating or the like onto the interlayer insulating layer 12, on which the pixel electrodes 13 and the pixel partition layers 141 are formed (FIG. 8C). Here, an application amount of the resin material has been determined in advance such that the bank material layer 140 after drying has a desired height of the banks 14.

Figure 8D:
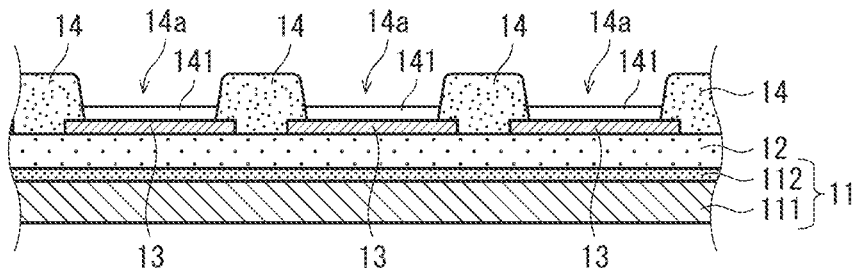

Then, the bank material layer 140 is patterned to make the banks 14 extending in the Y direction by photolithography and is baked at a predefined temperature, completing the banks 14 (FIG. 8D).

In the above process, the respective material layers for the pixel partition layers 141 and the banks 14 are both formed by a wet process and then are patterned. In at least one embodiment, at least one of the respective material layers for the pixel partition layers 141 and the banks 14 is formed by a dry process and then is patterned by photolithography and etching.

(5) Fourth Functional Layer (Hole Injection Layer, Hole Transport Layer) Forming Process A fourth functional layer forming process includes formation of the hole injection layers 15 and formation of the hole transport layers 16 (FIG. 6: Step S5).

First, the hole injection layers 15 are formed by ejecting ink containing an electrically-conductive polymer material such as PEDOT/PSS (mixture of polythiophene and polystyrene sulfonate) from nozzles 3011 of an application head 301 of a printing device to apply the ink into openings 14a, volatizing and removing solvent, and/or baking the solvent.

Then, the hole transport layers 16 are formed by applying ink containing material of the hole transport layers 16 onto the hole injection layers 15, volatizing and removing solvent, and/or baking the solvent. The material of the hole transport layers 16 is for example a high-molecular compound having no hydrophilic group such as polyfluorene, polyfluorene derivative, polyallylamine, and polyallylamine derivative. A method of applying the material is the same as in the case of the hole injection layers 15.

Figure 9A:
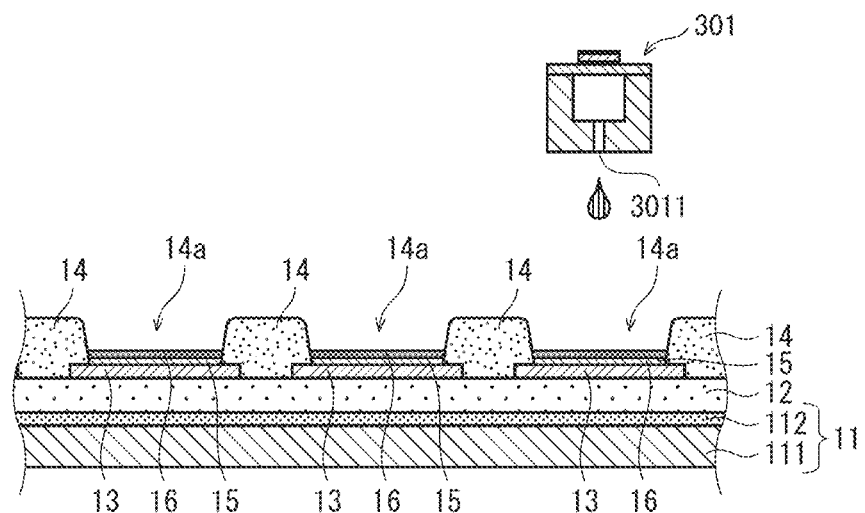
FIG. 9A and FIG. 9B are partial cross-section diagrams, continuing from FIG. 8D, schematically illustrating the manufacturing process of the organic EL elements 2 pertaining to at least one embodiment of the present disclosure.

FIG. 9A is a cross-section diagram illustrating the display panel 10 in the forming process of the hole transport layers 16 after the forming process of the hole injection layers 15.

(6) Light-Emitting Layer Forming Process

Next, light-emitting layers 17(R), 17(G), and 17(B) are formed on the hole transport layers 16 (FIG. 6: Step S6 and FIG. 10A).

Figure 9B:
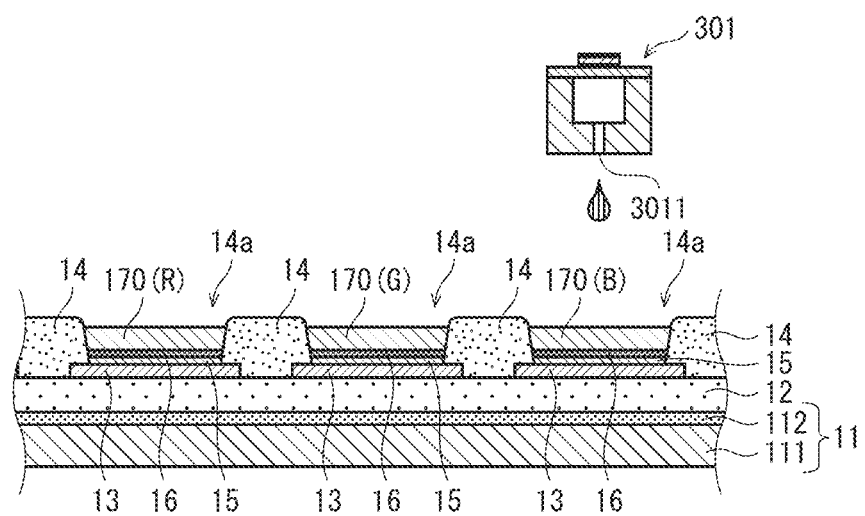

Specifically, as illustrated in FIG. 9B, ink containing a light-emitting material which is a material of light-emitting layers of a corresponding light emission color is sequentially ejected from the nozzles 3011 of the application head 301 of the printing device into the openings 14a onto the hole transport layers 16 in the openings 14a. Then, the substrate 11 after ink application is carried into a vacuum dry chamber and is heated in a vacuum, thereby evaporating an organic solvent in the ink. Thus, the light-emitting layers 17 are formed (FIG. 6: Step S6).

Figure 10A:
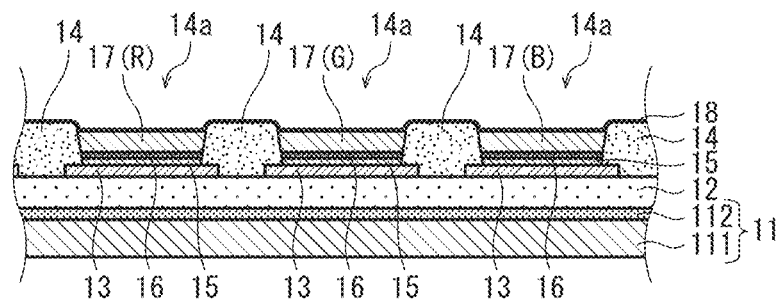
FIG. 10A to FIG. 10E are partial cross-section diagrams, continuing from FIG. 9B, schematically illustrating the manufacturing process of the organic EL elements 2 pertaining to at least one embodiment of the present disclosure.

(7) Hole Block and Electron Transport Layer (First Functional Layer) Forming Process As illustrated in FIG. 10A, on the light-emitting layers 17 and the banks 14, a hole block and electron transport layer 18 is formed by forming a film of sodium fluoride so as to have a film thickness of more than 0 nm and 5 nm or less by vacuum deposition or the like (FIG. 6: Step S7). In at least one embodiment, the film of sodium fluoride has a film thickness of 1 nm to 5 nm, for example a film thickness of 5 nm. The hole block and electron transport layer 18 is formed by film formation across all the subpixels.

(8) Electron Transport Layer (Second Functional Layer) Forming Process

Figure 10B:
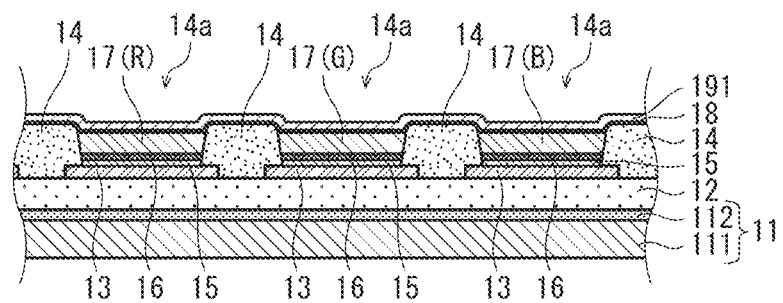

As illustrated in FIG. 10B, on the hole block and electron transport layer 18, an electron transport layer 191 is formed by forming a film of a first organic material so as to have a film thickness of 5 nm to 30 nm, for example a film thickness of 10 nm, by vacuum deposition (FIG. 6: Step S8). The first organic material has at least one of electron transport properties and electron injection properties. In the film formation of the electron transport layer 191, vapor deposition of the first organic material is performed with no inclusion of at least one metallic element M1, which is selected from the group consisting of alkali metals, alkaline earth metals, and rare earth metals that reduce the above metal fluoride such as sodium fluoride. The electron transport layer 191 is formed by film formation across all the subpixels.

(9) Electron Injection Transport Layer (Third Functional Layer) Forming Process

Figure 10C:
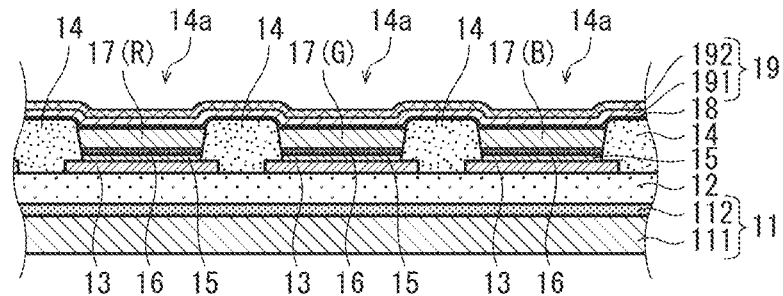

As illustrated in FIG. 10C, on the electron transport layer 191, an electron injection transport layer 192 is formed by forming a film of a second organic material, which has at least one of electron transport properties and electron injection properties, together with a metallic element M2 as a metal dopant by co-deposition using vacuum deposition so as to have a film thickness of 5 nm to 50 nm, for example a film thickness of 10 nm (FIG. 6: Step S9). The second organic material is doped with the metal dopant at a doping concentration, content percentage by weight, of 3 wt % to 60 wt %, for example at a doping concentration of 10 wt %. Also, in at least one embodiment, the electron transport layer 191 is a metal thin film formed from a metal selected from alkali metals, alkaline earth metals, or rare earth metals. In this case, the electron transport layer 191 has a film thickness of 0.1 nm to 5 nm, for example a film thickness of 1 nm. The electron injection transport layer 192 is formed by film formation across all the subpixels.

Through the above process, the functional layer 19 is formed.

(10) Counter Electrode Forming Process

Next, a counter electrode 20 is formed on the electron injection transport layer 192 (FIG. 6: Step S10).

Figure 10D:
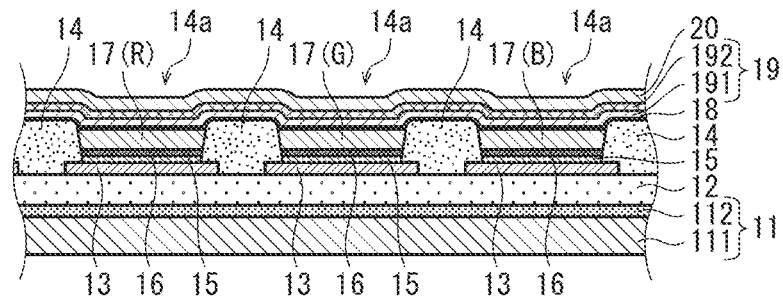

In a counter electrode forming process, a film of silver, aluminum, or the like is formed on the electron injection transport layer 192 by sputtering, vacuum deposition, or the like (FIG. 10D).

(11) Sealing Layer Forming Process

Figure 10E:
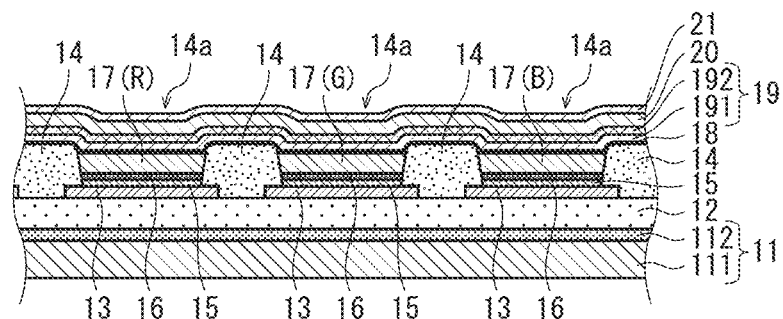

Next, as illustrated in FIG. 10E, a sealing layer 21 is formed on the counter electrode 20 (FIG. 6: Step S11). The sealing layer 21 can be formed by forming a film of SiON, SiN, or the like by sputtering, CVD, or the like.

Through the above process, a display panel 10 illustrated in FIG. 3 is complete. Note that the above manufacturing method is just an example and can be appropriately modified according to the spirit of the present disclosure.

4. Experimental Results of Element Operating Life and Drive Voltage with use of Organic EL Elements 2

Measurements of element operating life were performed with use of the organic EL elements 2 which are modified to have different layered structures including layers from the light-emitting layers 17 to the counter electrode 20. Table 1 indicates measurement results of element operating life. In Table 1, the element operating life indicates a light emission time elapsed until luminance has deteriorated to the value of 97% from the initial value, and is represented as relative values with reference to Sample 1.

TABLE 1

| No. | Layered structure | Operating life relative value (%) |
| --- | --- | --- |
| 1 | NaF/EIL | 100 |
| 2 | HBL/EIL | 3 |
| 3 | HBL/ETL/EIL | 1 |
| 4 | NaF/ETL/EIL | 204 |

Figure 11A:
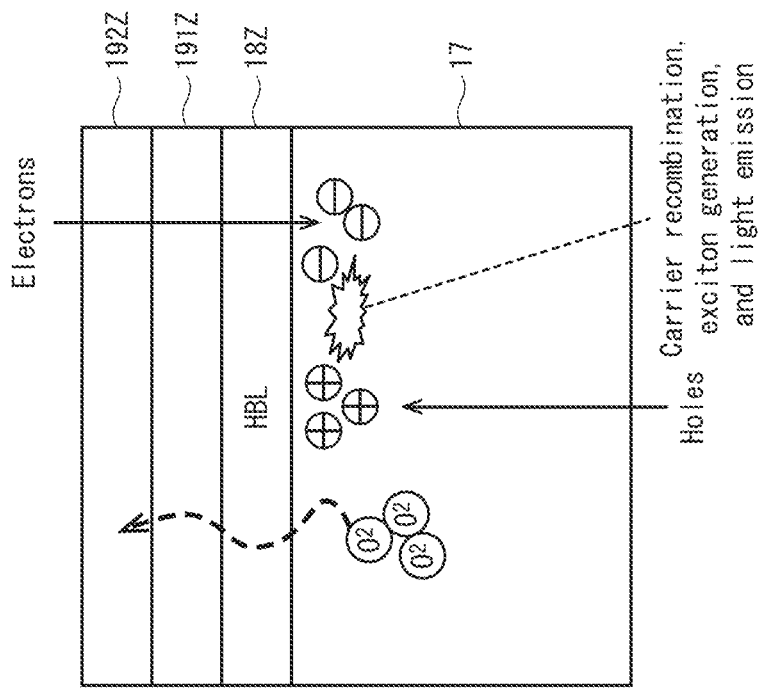
FIG. 11A is a schematic diagram illustrating a layered structure of organic EL elements 2Z pertaining to Sample 3.
Figure 11B:
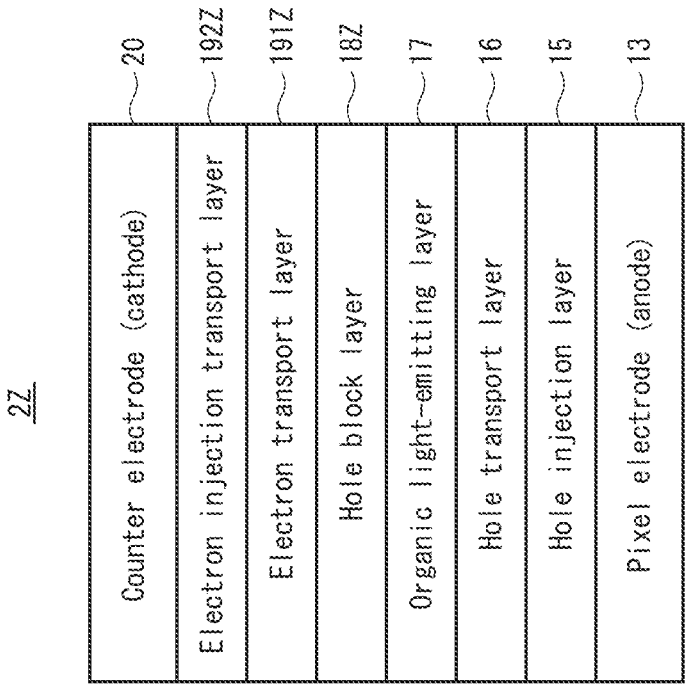
FIG. 11B is a diagram for explaining operations of the organic EL elements 2Z.

As test samples, Samples 1-3 pertaining to reference examples and Sample 4 pertaining to an example of at least one embodiment were used. The following indicates specifications of the samples. FIG. 11A is a schematic diagram illustrating a layered structure of organic EL elements 2Z pertaining to Sample 3, and FIG. 11B is a diagram for explaining operations of the organic EL elements 2Z. The organic EL elements 2Z include an electron transport layer 191Z as a second functional layer and an electron injection transport layer 192Z as a third functional layer.

Sample No. 1: The organic EL elements 2X illustrated in FIG. 14A were used as Sample 1. As a cathode-side layer adjacent to the organic light-emitting layers 17, a sodium fluoride layer (NaF) is provided. As a cathode-side layer adjacent to the sodium fluoride layer, the electron injection transport layer (EIL), which includes the organic material doped with the metallic element M1 reducing sodium fluoride, is provided.

Sample No. 2: The organic EL elements 2Y illustrated in FIG. 14B were used as Sample 2. As a cathode-side layer adjacent to the organic light-emitting layers 17, a hole block layer (HBL) is provided. As a cathode-side layer adjacent to the hole block layer, the electron injection transport layer (EIL), which includes the organic material doped with the metallic element M2 increasing electron transport properties, is provided.

Sample No. 3: The organic EL elements 2Z obtained by modifying the layered structure of the organic EL elements 2 were used as Sample 3. Specifically, as a cathode-side layer adjacent to the light-emitting layers 17, a hole block layer (HBL) is provided instead of the hole block and electron transport layer 18. Between the hole block layer (HBL) and an electron injection transport layer (EIL), an electron transport layer (ETL) including an organic material and not including the metallic element M1 reducing sodium fluoride is provided.

Sample No. 4: Organic EL elements obtained by modifying the layered structure of the organic EL elements 2 were used as Sample 4. Specifically, a hole block and electron transport layer 18, which is a sodium fluoride layer (NaF) adjacent to the light-emitting layers 17 on the cathode side, has a film thickness of 5 nm. Between the hole block and electron transport layer 18 (NaF) and an electron injection transport layer (EIL), an electron transport layer (ETL) including an organic material and not including the metallic element M1 reducing sodium fluoride is provided.

Note that the layered structure and film thickness in Samples 1 and 2 are as follows: the hole injection layer of 50 nm, the hole transport layers of 20 nm, the light-emitting layers of 85 nm, the cathode-side layer of 5 nm which is adjacent to the light-emitting layers, the electron injection transport layer of 1 nm, and the counter electrode. Also, the layered structure and film thickness in Samples 3 and 4 are as follows: the electron transport layer of 10 nm provided between the cathode-side layer adjacent to the light-emitting layers and the electron injection transport layer.

As illustrated in Table 1, the element operating life decreased in the following order: Sample 4>Sample 1>Sample 2>Sample 3. Specifically, the measurement results indicate that, with reference to the element operating life of Sample 1, the element operating life of Sample 2 is approximately 3% and the element operating life of Sample 3 is approximately 1%. Reasons for the results are considered as follows. The hole block layers of Samples 2 and 3 exhibited high hole block properties but exhibited low electron injection properties. This deteriorated a carrier balance and thus reduced the element operating life. In addition, the hole block layers of Samples 2 and 3 exhibited an insufficient function of preventing moisture etc. inside the light-emitting layers from penetrating through the electron injection transport layer to increase an environmental resistance. This deteriorated the electron injection transport layer, which is active, and thus reduced the element operating life.

Meanwhile, Sample 4 pertaining to the example was observed to have an operating life improved compared with Samples 1-3.

Sample 4 pertaining to the example was observed to have an operating life significantly improved compared with Sample 3. Specifically, according to Sample 3, as illustrated in FIG. 11B, the hole block layer exhibited an insufficient function of preventing moisture etc. inside the light-emitting layers 17 from penetrating through the electron injection transport layer 192Z to increase an environmental resistance. Due to this, the element operating life reduced, even though the metallic element M1 is not included in the electron transport layer 191Z. Meanwhile, it is presumed that, according to Sample 4, the sodium fluoride layer, which constitutes the hole block and electron transport layer 18, exhibited an excellent environmental resistance and this increased the element operating life.

Further, Sample 4 pertaining to the example was observed to have the element operating life improved to 204% with reference to Sample 1.

Reasons for this is considered as follows. According to Sample 4, the cathode-side layer adjacent to the hole block and electron transport layer 18 does not include the metallic element M1, which reduces sodium fluoride. Accordingly, by preventing dissociation of sodium fluoride which is included in the hole block and electron transport layer 18, deterioration in hole block properties was prevented and movement of holes and excitons was blocked. This helps to suppress: an occurrence that holes intrude into the electron injection transport layer 192, combine with electrons inside the electron injection transport layer 192 to generate excitons, thereby deteriorating the electron injection transport layer 192; or an occurrence that excitons generated in the light-emitting layers 17 diffuse in the electron injection transport layer 192 to deteriorate the electron injection transport layer 192, thereby reducing the element operating life.

Moreover, according to Sample 4, by preventing dissociation of sodium fluoride included in the hole block and electron transport layer 18, moisture etc. inside the light-emitting layers 17 is prevented from penetrating through the electron transport layer 191 and the electron injection transport layer 192. Thus, Sample 4 is considered to have the environmental resistance improved compared with Sample 1.

Figure 12:
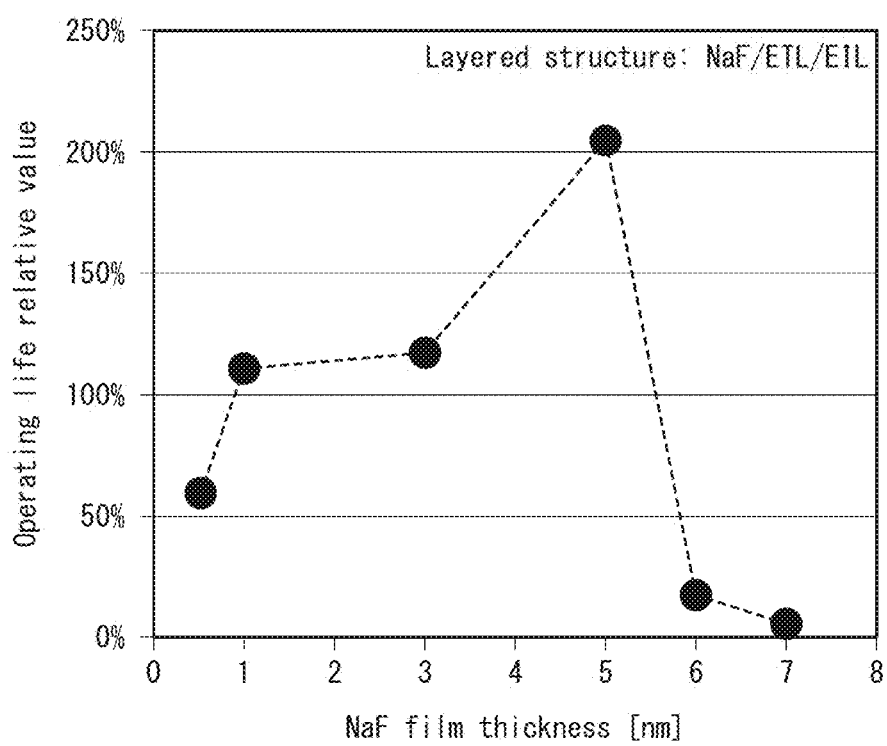
FIG. 12 is a diagram illustrating experimental results of a relationship between film thickness of the hole block and electron transport layer and an element operating life in the organic EL elements 2 pertaining to at least one embodiment of the present disclosure.

Next, an investigation was performed on a relationship between the film thickness of the sodium fluoride layer which is the hole block and electron transport layer 18 and the element operating life in the organic EL elements 2, with use of sodium fluoride layers which are modified to have film thicknesses which differ step by step. FIG. 12 is a diagram illustrating experimental results of a relationship between the film thickness of the hole block and electron transport layer 18 (first functional layer) and the element operating life in the organic EL elements 2. In FIG. 12, a relative value of element operating life indicates a relative value with reference to the measurement value in Sample 1 described above.

As test samples, the respective sodium fluoride layers having the film thicknesses of 0.5 nm, 1 nm, 3 nm, 5 nm, 6 nm, and 7 nm as the hole block and electron transport layer 18 of the organic EL elements 2 were used. These samples are equal to each other in terms of layered structure, film thicknesses of other layers, and rate of decrease in drive voltage.

As illustrated in FIG. 12, in a film thickness of 1 nm to 5 nm of the sodium fluoride layer, which constitutes the hole block and electron transport layer 18, a peak region where the element operating life is steeply improved compared with other film thickness ranges was observed.

In addition, in a film thickness of more than 3 nm and 5 nm or less, a peak at which the element operating life is further improved was observed.

When the film thickness exceeds 5 nm, the element operating life rapidly reduced. A reason for this is considered as follows. At the beginning of the operating life, as tunneling barriers increase with an increase in film thickness, electron injection properties deteriorate, and electrons are accumulated at the interface between the hole block and electron transport layer 18 and the electron transport layer, and thus strong application of an electric filed increases loads on an organic material of the electron transport layer. This accelerates deterioration of the electron transport layer, and thus further accelerates the deterioration in electron injection properties, results in acceleration of reduction in operating life.

Also, when the film thickness is less than 1 nm, the element operating life reduced. Reasons for this are considered as follows. Since uniform film formation at the film thickness of less than 1 nm is difficult in manufacturing, the sodium fluoride layer, which constitutes the hole block and electron transport layer 18, exhibits a deteriorated effect in environmental resistance. In addition, hole block properties decrease at the film thickness of less than 1 nm and thus a carrier balance deteriorates. Thus, the element operating life reduces.

In the experiment results illustrated in FIG. 12, the drive voltage was the lowest at the film thickness of 5 nm, and the carrier balance was the best at the film thickness of 5 nm. However, because the carrier balance varies depending on the structure of other layers in the layered structure such as a degree of movement of electrons/holes inside light-emitting layers, materials of hole injection layers, hole transport layers, and so on, it is possible to adjust a film thickness at which the carrier balance is best as necessary by adjusting these factors.

5. Experimental Results of Luminous Efficiency and Drive Voltage with use of Organic EL Elements 2

The drive voltage and the luminous efficiency were measured with use of Samples 3 and 4 as test samples. Table 2 indicates measurement results of a rate of decrease in drive voltage and the luminous efficiency. The rate of decrease in drive voltage indicates a voltage applied at a current density of 1 mA/cm$^2$ and is expressed as a relative value in Table 2. The rate of decrease in drive voltage is calculated as follows: [drive voltage before variation]/[drive voltage after variation]. The rate of decrease in drive voltage and the luminous efficiency in Table 2 indicate relative values with reference to Sample 3.

TABLE 2

| No. | Layered structure | Voltage reduction rate (%) | Luminous efficiency (%) |
| --- | --- | --- | --- |
| 3 | HBL/ETL/EIL | 100 | 100 |
| 4 | NaF/ETL/EIL | 105 | 118 |

As illustrated in Table 2, Sample 4 pertaining to the example was observed to have a rate of decrease in drive voltage and a luminous efficiency which are improved by approximately 5% and approximately 18% respectively compared with Sample 3. According to the measurement results on Sample 3, which uses the hole block layer, since the hole block properties were high but the electron injection properties were low, the carrier balance in the light-emitting layers was bad and the luminous efficiency was low. Meanwhile, according to the measurement results on Sample 4 pertaining to the example, the electron injection properties were high compared with Sample 3, and the carrier balance in the light-emitting layers was improved and thus the drive voltage reduced. Also, according to Sample 4, since the hole block properties and the electron injection properties were high, the carrier balance was improved and thus the luminous efficiency increased.

Note that, according to the conventional organic EL elements 2X, as described above, the intermediate layer, which is a layer of a metallic compound such as sodium fluoride, has the electron injection properties improved owing to a reduction action of the alkali metal fluoride of the intermediate layer to cause partial dissociation into alkali metal. This is exerted by the metallic element M1 such as barium, cesium, and lithium included in the electron injection transport layer, which is adjacent to the intermediate layer.

According to the organic EL elements 2, meanwhile, the electron transport layer 191 does not include a metallic element selected from the group consisting of alkali metals, alkaline earth metals, rare earth metals, and the like which reduce a metal fluoride such as sodium fluoride. Accordingly, dissociation of sodium fluoride cannot occur, and thus sodium fluoride of the hole block and electron transport layer 18 is present as a compound. It is considered that, according to the organic EL elements 2, the rate of decrease in drive voltage and the luminous efficiency were improved in the peak region (see FIG. 12) because of the following reason. Local presence of sodium fluoride in the first organic material increases local concentration of an electric field in sodium fluoride and thus increases the electron injection properties owing to tunneling, and this improves the carrier balance in the light-emitting layers. On the other hand, the present inventor studied that since the organic EL elements 2 were observed to have the rate of decrease in drive voltage and the luminous efficiency which are improved compared with the conventional organic EL elements 2X, prevention of dissociation of sodium fluoride thus to cause sodium fluoride to be present as a compound also contributes to suppression of deterioration in hole block properties in the organic EL elements 2.

With respect to tunneling in organic EL elements, "Bright high efficiency blue organic light-emitting diodes with Al$_2$O$_3$/Al cathodes" H. Tang, et al. (Applied Physics Letters, Nov. 3, 1997, Volume 71, Issue 18, pp. 2560-2562) describe that an aluminum film including an insulator layer formed from Al$_2$O$_3$ is used as a cathode which injects electrons to an electron transport layer on the electron transport layer side, such that electrons are injected to the electron transport layer via the Al$_2$O$_3$ layer owing to tunneling, thereby improving a current injection efficiency.

6. Review

As described above, the organic EL element 2 pertaining to at least one embodiment of the present disclosure includes: the pixel electrode 13; the light-emitting layer 17 that is disposed above the pixel electrode 13 and includes an organic light-emitting material; the hole block and electron transport layer 18 (first functional layer) that is disposed on the light-emitting layer 17 and includes sodium fluoride; the electron transport layer 191 (second functional layer) that is disposed on the hole block and electron transport layer 18 and includes the first organic material having at least one of electron transport properties and electron injection properties; and the counter electrode 20 that is disposed above the electron transport layer 191. The electron transport layer 191 does not include at least one metallic element M1 selected from the group consisting of alkali metals, alkaline earth metals, and rare earth metals that reduce a metal fluoride such as sodium fluoride.

This structure prevents the metallic element M1, which reduces a metal fluoride such as sodium fluoride, from affecting the hole block and electron transport layer 18 to cause reduction of the alkali metal fluoride included in the hole block and electron transport layer 18 and thus partial dissociation into sodium. Thus, deterioration in hole block properties can be prevented. At the same time, the properties of injecting electrons to the light-emitting layer 17 can be improved. With this, the hole block properties and the electron injection properties are achieved, and thus the carrier balance in the light-emitting layer can be improved. Also, by preventing dissociation of sodium fluoride included in the hole block and electron transport layer 18, moisture etc. inside the light-emitting layer 17 can be prevented from penetrating through the electron injection transport layer 192, thereby improving the environmental resistance. This helps the organic EL element to achieve the hole block properties, the electron injection properties, and the environmental resistance, thereby having an improved element operating life.

Also, in at least one embodiment, the group, from which the at least one metallic element M1 is selected, consists of barium, lithium, cesium, and ytterbium.

This structure helps to embody an organic EL element which achieves hole block properties and electron injection properties and thus has an improved carrier balance in light-emitting layer to thereby have an improved element operating life.

According to the conventional organic EL elements 2X, as described above, the intermediate layer, which is a layer formed from a metallic compound such as sodium fluoride, has electron injection properties improved owing to a reduction action of the alkali metal fluoride of the intermediate layer to cause partial dissociation into alkali metal. This is exerted by the metallic element M1 such as barium, cesium, and lithium included in the electron injection transport layer, which is adjacent to the intermediate layer.

According to the organic EL elements 2 as described above, compared with this, since the electron transport layer 191 does not include the metallic element M1 reducing a metal fluoride such as sodium fluoride, the metallic element M2 included in the electron injection transport layer 192 does not affect sodium fluoride included in the hole block and electron transport layer 18. Accordingly, an amount of the metallic element M2 in the electron injection transport layer 192 can be set to be optimal for the electron injection properties of the electron transport properties of the electron injection transport layer 192. With no need to determine the amount of the metallic element M2 taking into consideration of reduction of the alkali metal fluoride included in the hole block and electron transport layer 18, the electron injection properties and the electron transport properties of the electron injection transport layer 192 can be further increased.

As described above, the self-luminous element and the self-luminous display panel pertaining to at least one aspect of the present disclosure exhibit hole block properties, electron injection properties, and environmental resistance, and thus have an improved element operating life.

<<Modifications>>

The organic EL elements 2 and so on pertaining to at least one embodiment have been described, but the present disclosure is not limited to the embodiment described above. For example, various modifications achievable by a person having ordinary skill in the art, and any combination of elements and functions of embodiments and modifications that do not depart from the spirit of the present invention are also included in the present disclosure. The following describes modifications of organic EL elements and organic EL display panels as examples of such embodiments.

(1) According to the organic EL element pertaining to at least one embodiment, the hole injection layer and the hole transport layer are disposed between the pixel electrode and the light-emitting layer. However, the present disclosure is not limited to this structure. For example, a hole transport layer or an electron injection transport layer may be disposed, without using the hole injection layer and the hole transport layer. Alternatively, any one or more or all of a hole injection layer, a hole transport layer, and an electron injection transport layer may be disposed. In addition, all these layers do not need to include an organic compound and any of these layers may include an inorganic substance or the like.

(2) According to the display panel 10 pertaining to at least one embodiment, as illustrated in FIG. 2, the pixel partition layers 141 extend in the long-axis X direction of the display panel 10 and the banks 14 extend in the short-axis Y direction of the display panel 10. However, the present disclosure is not limited to this. The extending directions of the pixel partition layers 141 and the banks 14 may be reversed. Alternatively, the extending directions of the pixel partition layers 141 and the banks 14 may be directions independent of the shape of the display panel 10.

Also, according to the display panel 10 pertaining to at least one embodiment, the image display surface has a rectangular shape as an example. However, the shape of the image display surface is not limited to this and may be modified as appropriate.

Further, according to the display panel 10 pertaining to at least one embodiment, the pixel electrodes 13 are rectangular plate-like members. However, the present disclosure is not limited to this.

Moreover, in at least one embodiment, the description has been provided on an organic EL display panel employing the line bank structure. However, the present disclosure is not limited to this and may be an organic EL display panel employing a so-called pixel bank structure in which all sides of each subpixel are surrounded by banks.

(3) In at least one embodiment, the hole injection layers 15, the hole transport layers 16, and the light-emitting layers 17 are all formed by a printing method (application method). However, the present disclosure is not limited to this. Only one layer among these layers may be an applied film which is formed by a printing method. Note that whether a certain layer in a finished product of the display panel 10 is an applied film or not can be easily determined by detecting moisture or solvent remaining in the layer.

(4) In at least one embodiment, the hole injection layers 15 are formed by a printing method using an ink including an electrically-conductive polymer material. Alternatively, a film of transition metal oxide may be formed by vapor deposition or sputtering. In the case where the hole injection layers 15 are formed from transition metal oxide, a plurality of oxidation numbers are taken, thereby achieving a plurality of energy levels, and as a result, hole injection can be facilitated and drive voltage can be reduced. Tungsten oxide is suitable as such metal oxide.

This structure increases a hole injection amount with an increase in electron injection amount, thereby achieving a carrier balance with a further large exciton amount. Thus, a further improvement in luminous efficiency is expected.

In this case, a metal material layer for pixel electrodes and a tungsten oxide layer are firstly layered and then are patterned by photolithography and wet etching, such that pixel electrodes 13 and hole injection layers 15 are simultaneously formed. Subsequently, banks 14 and pixel partition layers 141 are formed. This helps to facilitate the manufacturing process.

(5) In the display panel 10 pertaining to at least one embodiment, the subpixels 100R, 100G, and 100B, which emit light of the R, G, and B colors respectively, are arranged. However, the light emission colors of the subpixels are not limited to these and may be for example four colors including yellow (Y) color in addition to the R, G, and B colors. Also, the number of subpixels per color arranged in one pixel P is not limited to one, and may be plural. Further, the arrangement order of the subpixels in each pixel P is not limited to the red, green, and blue colors such as illustrated in FIG. 2, and the subpixels may be reordered among these colors.

(6) Further, in at least one embodiment, the display panel 10 employs the active matrix system. However, the present disclosure is not limited to this, and a passive matrix system may be employed.

Moreover, the present disclosure is applicable not only to organic EL display panels of the top-emission type but also to organic EL display panels of a bottom-emission type.

In the case of the bottom-emission type, the counter electrode 20 is a light-reflective anode and the pixel electrodes 13 are cathodes including a light-transmissive material (including a light-semitransmissive material). In accordance with this, the layering order of other layers including the hole block and electron transport layer 18 and the electron transport layer 191 is different from that in the top-emission type.

In addition, the present disclosure is applicable to self-luminous display panels for quantum dot display devices employing colloidal quantum dots for example.

<<Supplement>>

The embodiments described above each indicate one beneficial specific example of the present invention. Numerical values, shapes, materials, constituent elements, arrangement positions and connections of constituent elements, steps, order of steps, and the like indicated in the embodiments are merely examples and are not intended to limit the present invention. Further, among constituent elements in the embodiments, any elements not described in independent claims representing top level concepts of the present invention are described as constituent elements constituting a more beneficial embodiment.

Further, the order described above in which steps are executed is for illustrative purposes, and the steps may be in an order other than described above. Further, a portion of the steps described above may be executed simultaneously (in parallel) with another step.

Further, in order to facilitate understanding of the invention, constituent elements in each drawing referenced by description of an embodiment are not necessarily drawn to scale. Further, the present invention is not limited to the description of the embodiments, and can be appropriately changed without departing from the scope of the present invention.

Further, at least a portion of functions of each embodiment and each modification may be combined.

Further, the present disclosure includes various modifications of the embodiments that are within the scope of ideas conceivable by a person skilled in the art.

Although the technology pertaining to the present disclosure has been fully described by way of examples with reference to the accompanying drawings, various changes and modifications will be apparent to those skilled in the art. Therefore, unless such changes and modifications depart from the scope of the present disclosure, they should be construed as being included therein.

The invention claimed is:

1. A self-luminous element comprising:
   a pixel electrode;
   a light-emitting layer that is disposed above the pixel electrode and includes a light-emitting material;
   a first functional layer that is disposed on the light-emitting layer and includes a metal fluoride;
   a second functional layer that is disposed on the first functional layer and includes a first organic material having at least one of electron transport properties and electron injection properties; and
   a counter electrode that is disposed above the second functional layer, wherein
   the second functional layer does not include at least one metallic element selected from the group consisting of alkali metals, alkaline earth metals, and rare earth metals that reduce the metal fluoride.

2. The self-luminous element of claim 1, wherein
   the metal fluoride is a fluoride of a metal selected from alkali metals, alkaline earth metals, or rare earth metals.

3. The self-luminous element of claim 1, wherein
   the metal fluoride is a sodium fluoride.

4. The self-luminous element of claim 1, wherein
   the group consists of barium, lithium, cesium, and ytterbium.

5. The self-luminous element of claim 1, wherein
   the first functional layer has a film thickness of 5 nm or smaller.

6. The self-luminous element of claim 5, wherein
   the first functional layer has the film thickness from 1 nm to 5 nm.

7. The self-luminous element of claim 1, wherein
   the second functional layer has a film thickness from 5 nm to 30 nm.

8. The self-luminous element of claim 1, wherein
   the first functional layer has a film thickness equal to or smaller than a film thickness of the second functional layer.

9. The self-luminous element of claim 1, further comprising
   a third functional layer that is disposed on the second functional layer and below the counter electrode, and includes a second organic material doped with at least one metallic element selected from alkali metals, alkaline earth metals, or rare earth metals, the second organic material having at least one of electron transport properties and electron injection properties.

10. The self-luminous element of claim 1, further comprising
    a third functional layer that is disposed on the second functional layer and below the counter electrode, and includes at least one metallic element selected from alkali metals, alkaline earth metals, or rare earth metals.

11. The self-luminous element of claim 9, wherein
    the metallic element included in the third functional layer is ytterbium.

12. The self-luminous element of claim 9, wherein
    the metallic element included in the third functional layer differs from a metallic element included in the first functional layer.

13. The self-luminous element of claim 1, wherein
    the pixel electrode is light-reflective, and
    the counter electrode is light-semitransmissive.

14. The self-luminous element of claim 1, further comprising
    a fourth functional layer that is disposed above the pixel electrode and below the light-emitting layer, and includes an organic material having at least one of hole transport properties and hole injection properties.

15. The self-luminous element of claim 14, wherein
    at least one of the light-emitting layer and the fourth functional layer has a film thickness varying depending on a wavelength of light emitted from the light-emitting layer.

16. The self-luminous element of claim 14, wherein
    at least one of the light-emitting layer and the fourth functional layer is an applied film.

17. A self-luminous display panel in which self-luminous elements are arranged in a matrix of rows and columns above a substrate, the self-luminous elements each comprising:
    a pixel electrode;
    a light-emitting layer that is disposed above the pixel electrode and includes a light-emitting material;
    a first functional layer that is disposed on the light-emitting layer and includes a metal fluoride;

a second functional layer that is disposed on the first functional layer and includes a first organic material having at least one of electron transport properties and electron injection properties;
a counter electrode that is disposed above the second functional layer;
banks extending in a column direction to partition between the light-emitting layers of the self-luminous elements arranged in a row direction, wherein
the second functional layer does not include at least one metallic element selected from the group consisting of alkali metals, alkaline earth metals, and rare earth metals that reduce the metal fluoride.

\* \* \* \* \*